United States Patent
Ashrafzadeh

(10) Patent No.: US 10,964,928 B2
(45) Date of Patent: Mar. 30, 2021

(54) METHODS AND SYSTEMS FOR MANAGING MULTI-CELL BATTERIES

(71) Applicant: Nova Semiconductor, Inc., Morgan Hill, CA (US)

(72) Inventor: Ahmad Ashrafzadeh, Morgan Hill, CA (US)

(73) Assignee: Nova Semiconductor, Inc., Morgan Hill, CA (US)

( * ) Notice: Subject to any disclaimer, the term of this patent is extended or adjusted under 35 U.S.C. 154(b) by 88 days.

(21) Appl. No.: 16/179,008

(22) Filed: Nov. 2, 2018

(65) Prior Publication Data
US 2019/0148701 A1    May 16, 2019

Related U.S. Application Data

(60) Provisional application No. 62/586,884, filed on Nov. 15, 2017.

(51) Int. Cl.
| | | |
|---|---|---|
| H01M 2/20 | (2006.01) | |
| H02J 7/00 | (2006.01) | |
| H02M 7/155 | (2006.01) | |
| G01R 31/3835 | (2019.01) | |
| H03K 19/17784 | (2020.01) | |

(52) U.S. Cl.
CPC ........ *H01M 2/202* (2013.01); *G01R 31/3835* (2019.01); *H02J 7/0014* (2013.01); *H02J 7/0021* (2013.01); *H02M 7/1557* (2013.01); *H03K 19/17784* (2013.01)

(58) Field of Classification Search
CPC .............. H02J 7/0014; H02M 7/1557; G01R 31/3835; H03K 19/17784; H01M 2010/4271; H01M 10/425; H01M 10/482
See application file for complete search history.

*Primary Examiner* — Ladan Mohaddes
(74) *Attorney, Agent, or Firm* — Seyfarth Shaw LLP; Puya Partow-Navid

(57) ABSTRACT

A resistor ladder comprising identical resistors is disposed electrically in parallel with a multicell battery to calibrate voltage-controlled oscillators or analog-to-digital converters for voltage balancing the battery cells in the multicell battery. Switches in a first state provide the voltage across each resistor as inputs to the VCOs or ADCs. The number of oscillations of the output signal of each VCO or ADC over a predetermined time period are compared to determine an offset error. Switches in a second state provide the voltage across each battery cell as inputs to the VCOs or ADCs. The battery cells with a higher relative voltage can be discharged until they are balanced. Some aspects describe temperature-adjusted and interpolated determinations of electrical quantities in the cells such as voltage and/or current.

16 Claims, 23 Drawing Sheets

2100

2110

USING RESISTOR ELEMENT

2120

USING 1 OF THE MOSFETS

2130

USING 2 MOSFETS

METHODS AND SYSTEMS FOR MANAGING MULTI-CELL BATTERIES

RELATED APPLICATIONS

This application is related to and claims the benefit and priority of U.S. Provisional Application No. 62/586,884 filed on Nov. 15, 2017, which is hereby incorporated by reference.

TECHNICAL FIELD

The present application relates generally to voltage sensors for balancing and protecting multicell batteries.

BACKGROUND

In charging multiple battery cells in series, it is desired to keep a balanced voltage between the cells to ensure a safe and effective charge operation. In the case where the cell voltages are not equal when charging multiple cells in series, it is possible to exceed the maximum voltage on a given cell, causing the cell to fail catastrophically, or to trigger a protection circuit to actuate a safety switch to avoid battery cell overcharge, causing a dead battery pack or preventing a full charge of the pack. The catastrophic failure can result in explosion and fire, which could be disastrous and life threatening in many cases. In the case where the safety switch is triggered early due to the mismatches, the capacity of the battery pack is dramatically reduced, which is costly and a nuisance.

Conventionally and in the prior arts, the approach to provide a charge balance, has generally been done to use extremely accurate analog to digital converters (ADCs) to measure the voltage of every cell, then follow by comparing the measured result for every cell, so that a decision can be made as to how to overcome the imbalance. However, current solutions, whether in discrete form or in an integrated circuit, are too expensive and potentially cost prohibitive to be used in many cost sensitive applications, such as in portable computer battery packs and other applications where more than one cell in series are used.

Another approach in the prior art has been to set a threshold just below the maximum voltage, such that during the charge, the first set of batteries that pass this threshold will be bypassed by a switch, such that the battery cells with lower voltage get a chance to rise up. This is an attempt to force balancing, but in reality it is not a very effective method. For instance, if the user never charges the batteries to the said level, the balancing act will not be triggered.

One method of charge balancing can be a passive discharge of any cell(s) with too high of a voltage to match the voltage of the battery cell(s) of the lowest value. This passive discharge can be an effective and low-cost solution. However, other complex methods can be implemented to direct the charge into the lower-voltage cells in an attempt to bring those up to the same level as the higher voltage cells to achieve equal voltage amongst all cells.

In examples of integrated circuit solutions from Texas Instruments, Analog Devices and also Linear Technology (now a part of Analog Devices), one can see the use of ADCs with resolutions around 14 to 16 bit. This is a high order of accuracy and costly, as the implementation is bulky in silicon area, and also requires extensive test and trimming during manufacturing of the integrated circuit to assure accuracy, which is also very costly. Any inaccuracy in the ADC measurement can result in error in measuring the cell voltage, defying the purpose of such a circuit.

There have been two approaches in using an ADC to measure the voltage across each cell of a multicell battery prior to charge balancing. One approach is to use a common ADC but switch the input with time intervals to measure each cell using the same ADC.

FIG. 1 shows an example of such a system 10 where a multiplexed configuration is used to measure every battery cell using the same ADC. S1 and S2 are moved concurrently to connect the inputs of the ADC to the battery terminals of a single battery cell (B1, B2, B3, B4, B5, or B6) at any given time, such that the inputs to the ADC are the terminals of B1, B2, B3, B4, B5, or B6 at any instance. This has the benefit of simplicity and reuse of the ADC for multiple cells, but has the complexity of the analog switch S1 and S2 implementation, as well as the complexity of floating the ADC and keeping a relative accuracy. The fact that there is only one ADC that is time multiplexed to measure multiple battery cell voltages also results in lack of immunity to load injected noise, as the measurements of all cells are not done concurrently to have noise effect all readings in the same way.

FIG. 2 shows a system 20 where, instead of floating the ADC, analog level shifters are used to translate each battery cell voltage to a fixed point, such as a ground referenced voltage, and then multiplexed using S1 and S2 to connect to the ADC terminal. The problem with this system 20 is the complexity and inaccuracy of such analog level shifters.

Another approach in using an ADC to measure the voltage across each cell of a multicell battery prior to charge balancing is to use multiple ADCs, such that each cell is measured by a dedicated ADC. An example of such a system 30 is illustrated in FIG. 3. Each ADC is followed by a digital level shifter to bring the ADC conversion results to a single point, where a digital circuit can process all the data and readings from all the cells. This system 30 has the drawbacks, complexities, and costs of multiple ADCs.

There are advantages and disadvantages for each of these approaches. In the case where multiple high-resolution ADCs are used, one can see how the cost is driven up, as such high-resolution ADCs are not low in cost, so having multiple instances will add significant cost. This approach also has another drawback, which is any variation between ADCs will directly result in non-ideal balancing as intended. The benefit of such a system is that the data conversion for multiple cells can be done simultaneously, which will reduce the possibility of noise interference caused by variability and non-constant load, which is quite common.

The approach of using a single ADC, multiplexed to measure multiple cells, has no way of assuring immunity to load variation over the entire measurement, other than heavy filtering and averaging, which could have its own adverse effects. Other disadvantages of this system can be related to the fact that ADCs are switched amongst cells in series, using non-ideal switches. Circuits that provide such switches can be the source of inaccuracies, as they have to have identical input to output ratios going from the first cell with respect to the ground to the highest cell, away from the ground. Level shifting of such analog voltages can be inaccurate and prone to error, known to experienced analog IC designers, and well understood. The benefit of this system is that the cost is reduced, as there is only one instance of a high-resolution ADC, and since there is only one ADC, the issue of variations between ADCs is removed.

The cases above rely on the accuracies of the ADCs and the associated circuits, so any added inaccuracy after packaging and final test and trimming, will again cause a less than perfect measurement and potentially diminishing the benefits. Such inaccuracies after final test and trimming can arise due to package shift, thermal imbalance and nonlinear temperature coefficients of the ADCs and supporting circuits, as well as to aging.

It would be desirable to overcome one or more these and/or other deficiencies in the art.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

Some embodiments are directed to a system comprising a multicell battery having n battery cells disposed in series electrically with each other; a resistor ladder comprising n resistors of same value connected in series electrically with each other, the resistor ladder connected in parallel electrically with the multicell battery; n voltage sensors; n resistor circuits, each resistor circuit extending across first and second sides of each resistor to measure a resistor voltage across a corresponding resistor; n battery cell circuits, each battery cell circuit extending across first and second terminals of each battery cell to measure a battery cell voltage across a corresponding battery cell; a plurality of switches configured to operate in a first state or a second state, the first state electrically coupling each resistor circuit to an input of a corresponding voltage sensor and the second state electrically coupling each battery cell circuit to the input of the corresponding voltage sensors; a logic circuit electrically coupled to an output of each voltage sensor; a memory circuit electrically coupled to the logic circuit, wherein when the switches are in the first state, each voltage sensor converts the corresponding resistor voltage to a resistor output signal having a property that corresponds to the resistor voltage, and when the switches are in the second state each voltage converts the corresponding battery cell voltage to a battery cell output signal having a property that corresponds to the battery cell voltage; and wherein said logic circuit determines a relation of every battery cell voltage with respect to an ideal balance voltage and other battery cell voltages.

Yet other embodiments are directed to a method for balancing a multi-cell battery, comprising operating a plurality of switches in a first state to direct current from a multicell battery across a resistor ladder that comprises a plurality of identical resistors; providing a resistor voltage across each identical resistor as an input to a corresponding voltage sensor; with each voltage sensor, converting the corresponding resistor voltage to a resistor output signal, the resistor output signal having a property that corresponds to the resistor voltage; determining an offset in the property for each voltage sensor; operating a plurality of switches in a second state to direct a respective output signal from the terminals of each battery cell in the multicell battery to the corresponding voltage sensor; providing a battery cell voltage across each battery cell as the input to the corresponding voltage sensor; with each voltage sensor, converting the corresponding battery cell voltage to a battery cell output signal, the battery cell output signal having a property that corresponds to the battery cell voltage; applying the offsets in the property to determine a relative corrected battery cell voltage for each battery cell.

Yet other embodiments are directed to a method for controlling an electrical system such as a multi-cell battery system, but not limited thereto, comprising obtaining a first set of known electrical outputs of an electrical quantity sensor at a first known temperature; obtaining a second set of known electrical outputs of said electrical quantity sensor at a second known temperature that is different from said first known temperature; measuring an operational temperature of at least one location in said battery system; using said measured operational temperature, computing a pair of reference electrical output values corresponding to the measured operational temperature using the previously-obtained sets of known electrical outputs at the first and second known temperatures; and interpolating among said pair of computed reference electrical output values to determine a temperature-corrected electrical quantity based on the measured operational temperature and said reference electrical output values.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

Figure 1:
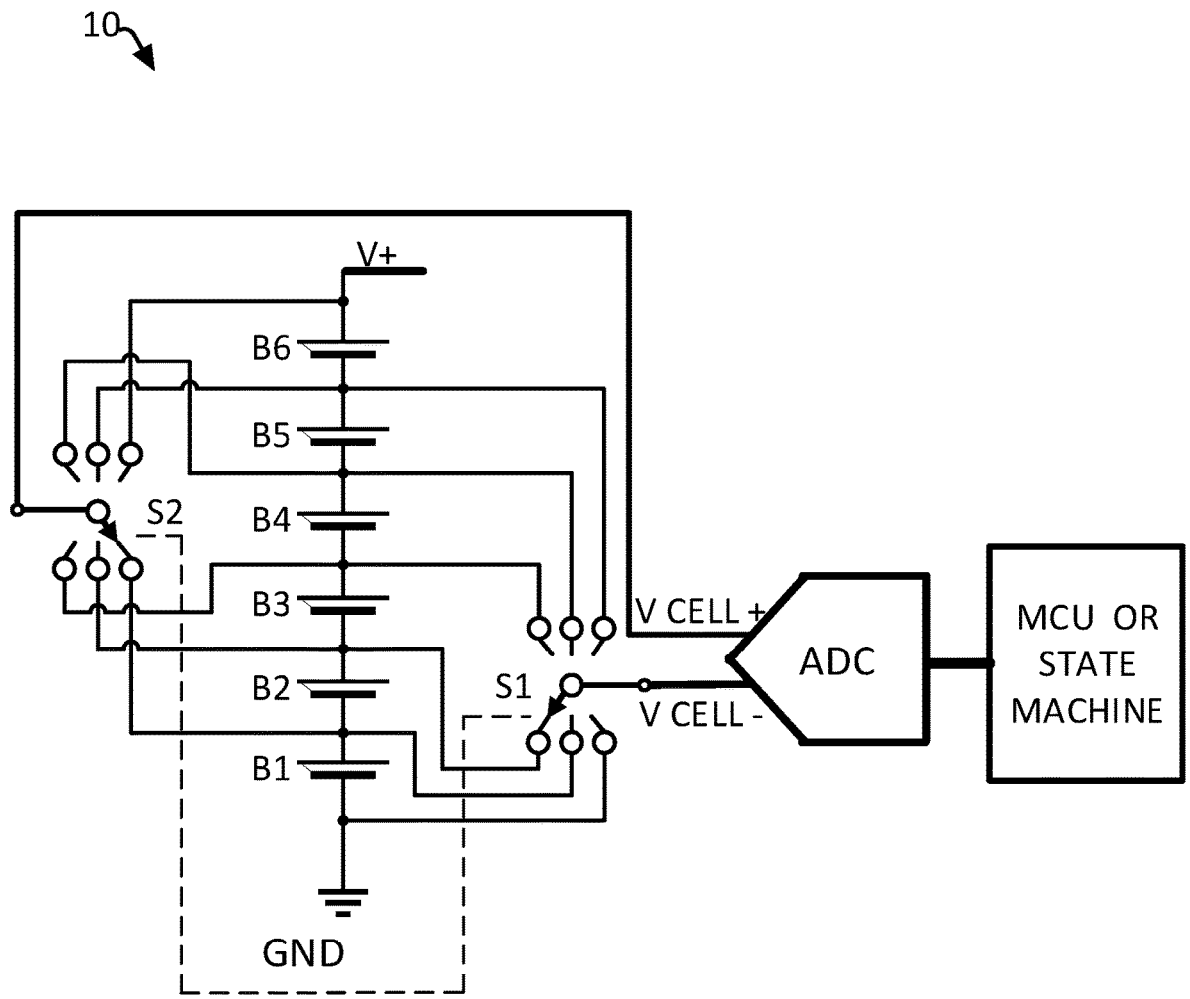
FIG. 1 is a schematic of an example system where a multiplexed configuration is used to measure every battery cell using the same ADC according to the prior art.
Figure 2:
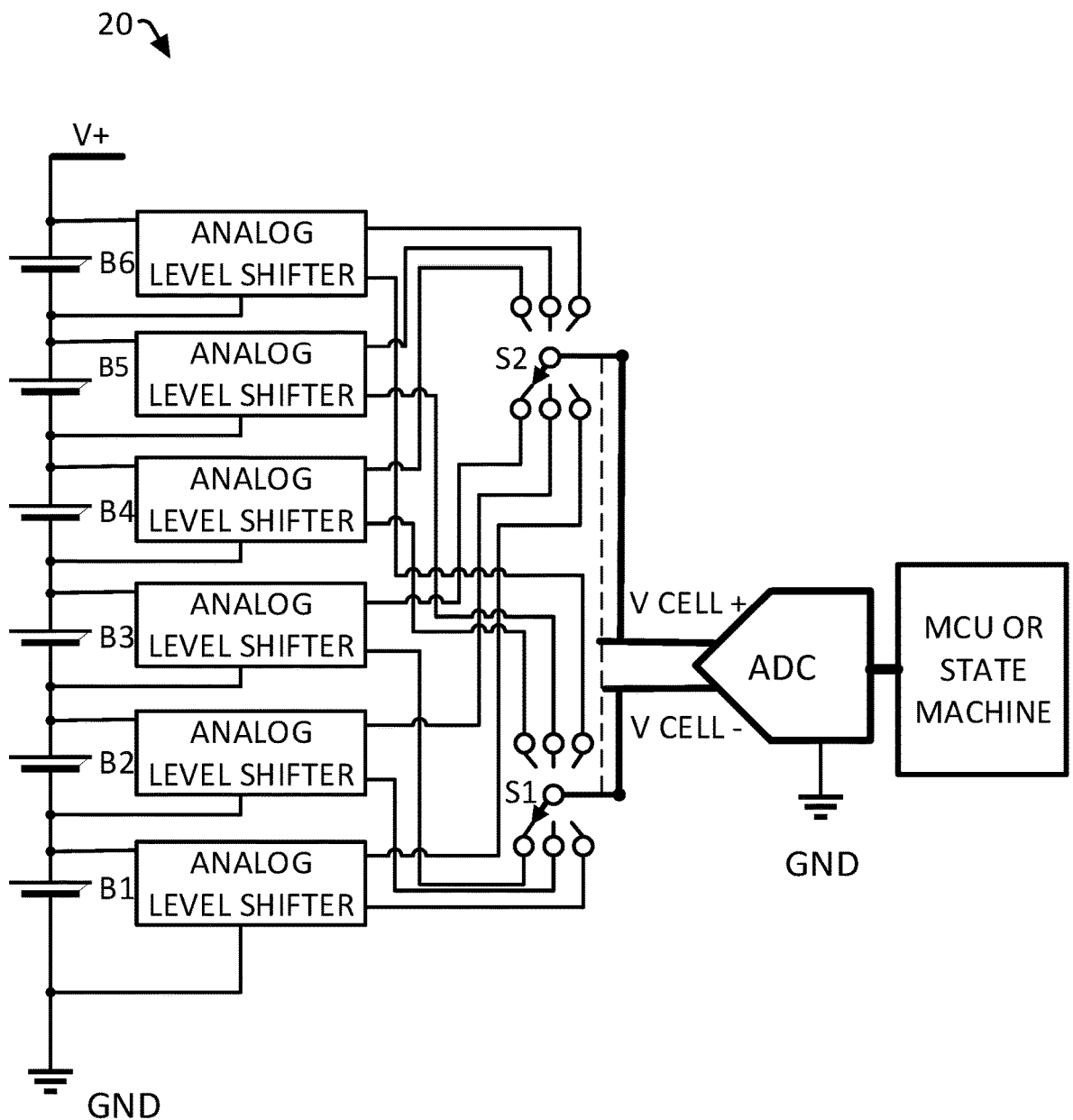
FIG. 2 illustrates the system of FIG. 1 with analog level shifters to translate each battery cell voltage to a fixed point, such as a ground referenced voltage, and then multiplexed using S1 and S2 to connect to the ADC terminal according to the prior art.
Figure 3:
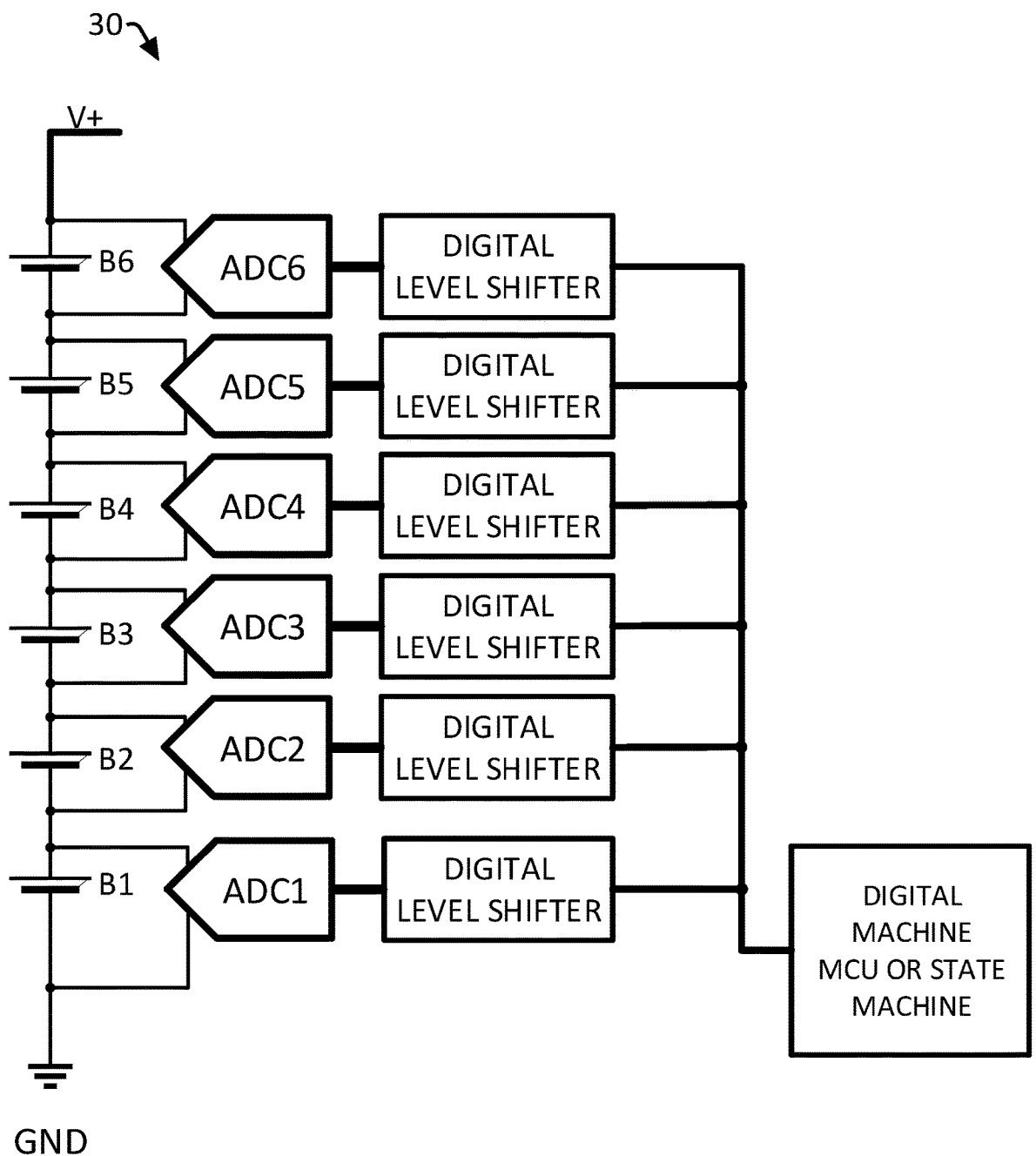
FIG. 3 is a schematic of an example system that uses a dedicated ADC to measure each battery cell voltage according to the prior art.
Figure 4:
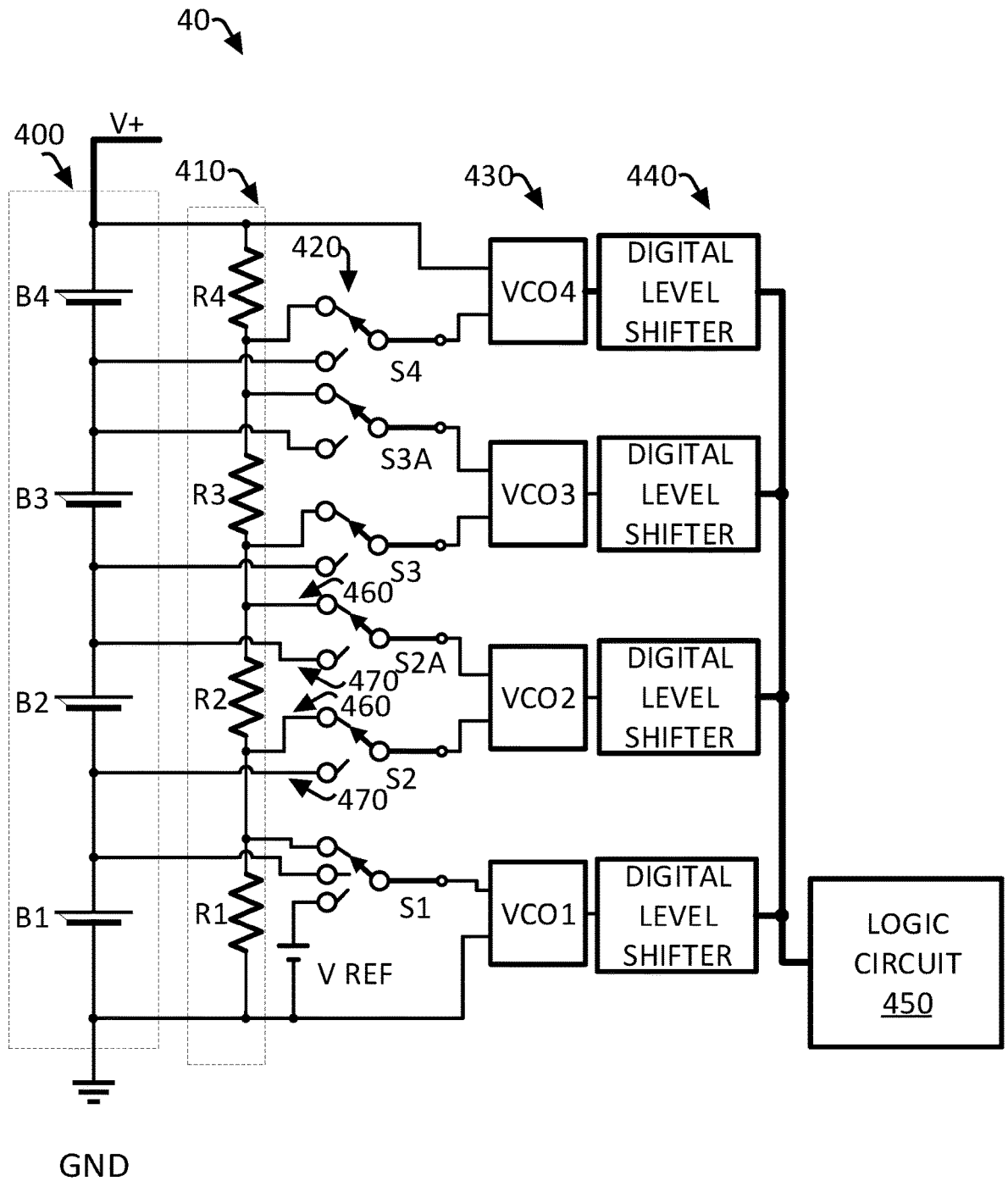
FIG. 4 is a schematic of a system 40 for measuring the voltage across each cell of a multicell battery prior to charge balancing according to one or more embodiments.

FIG. 4 is a schematic of a system 40 for measuring the voltage across each cell of a multicell battery prior to charge balancing according to one or more embodiments. The system 40 includes a multicell battery 400, a resistor ladder 410, a plurality of switches 420 including switches S1, S2, S2A, S3, S3A, and S4, a plurality of voltage-controlled oscillators (VCOs) 430 including VCO1-VCO4, a plurality of digital level shifters 440, and a logic circuit 450.

The multicell battery 400 includes a plurality of battery cells B1-B4. The battery cells B1-B4 are disposed in series electrically with each other. The battery cells B1-B4 may be identical, but differences in design or manufacturing or imperfections that develop over time can cause the cells to diverge from one another in a variety of ways, thus requiring balancing of the cells. The resistor ladder 410 includes a plurality of resistors R1-R4 that are disposed in series electrically with each other. The resistors R1-R4 are identical or substantially identical (in general, identical) to one another. In general, there are n battery cells B1-Bn and n resistors R1-Rn. Although the battery cells B1-B4 and resistors R1-R4 are described as being identical or substantially identical to one another, respectively, it is understood that there may be some variation between battery cells and/or resistors due to manufacturing, impurities, defects, material sourcing, and/or another reason.

The multicell battery 400 is disposed in parallel electrically with the resistor ladder 410. Since the resistors R1-R4 are identical to one another, the combined voltage across the multicell battery 400 is evenly divided across each resistor R1-R4 regardless of the voltage of each battery cell (e.g., whether the voltages are equal or unequal to one another). Thus, the voltage across each resistor R1-R4 represents or mimics an ideal balanced voltage of the battery cells B1-B4. As an example, if the battery cells B1-B4 are evenly balanced, the voltage across B1 would be equal to the voltage across R1, the voltage across B2 would be equal to the voltage across R2, the voltage across B3 would be equal to the voltage across R3, and the voltage across B4 would be equal to the voltage across R4. If one or more of the cells are out of balance, then this would not be true and one or more battery cell voltage(s) would not match the associated voltage across the resistor(s).

Each VCO 430 is electrically coupled to at least one switch 420. In FIG. 4, the top and bottom VCOs 430 (VCO4 and VCO1, respectively) are electrically coupled to one switch 420 (switches S4 and S1, respectively). The middle VCOs (VCO2 and VCO3) are electrically coupled to two switches 420 (S2 and S2A for VCO2 and S3 and S3A for VCO3). Thus in general there is a total of (n−2)×2+2 switches 420 where n is the number of battery cells or VCOs. In some embodiments, the top and bottom VCOs can be electrically coupled to two switches, in which case there is a total of 2n switches 420. The system 40 can include additional switches as described herein.

Figure 5:
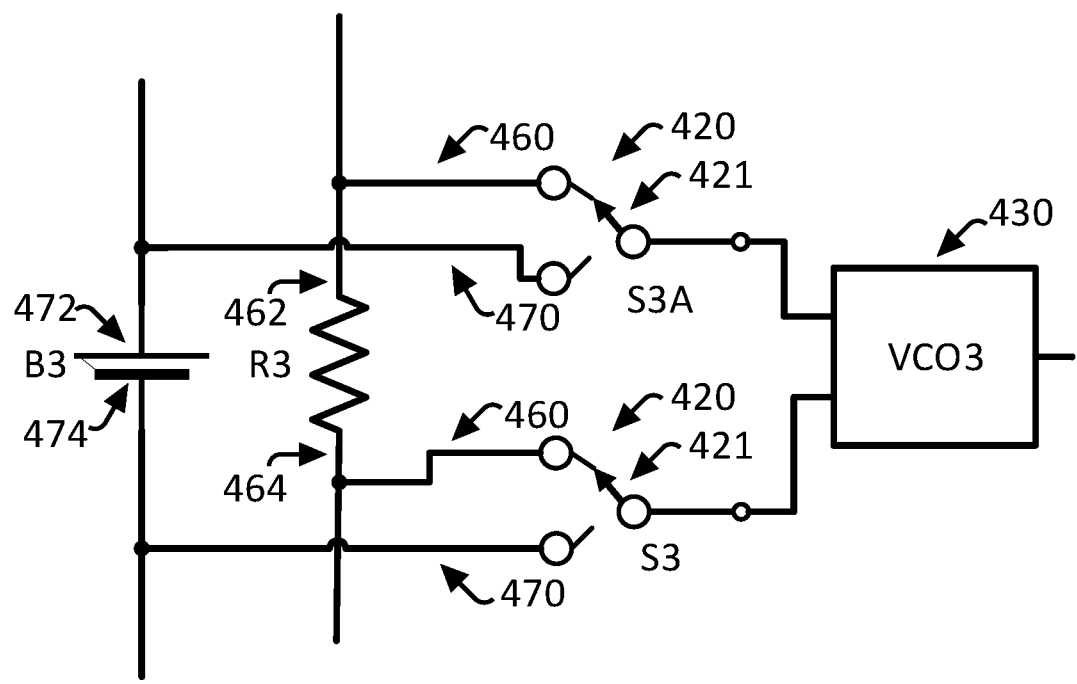
FIG. 5 is a schematic of a representative channel in the system of FIG. 4 with the switches in the first state.
Figure 6:
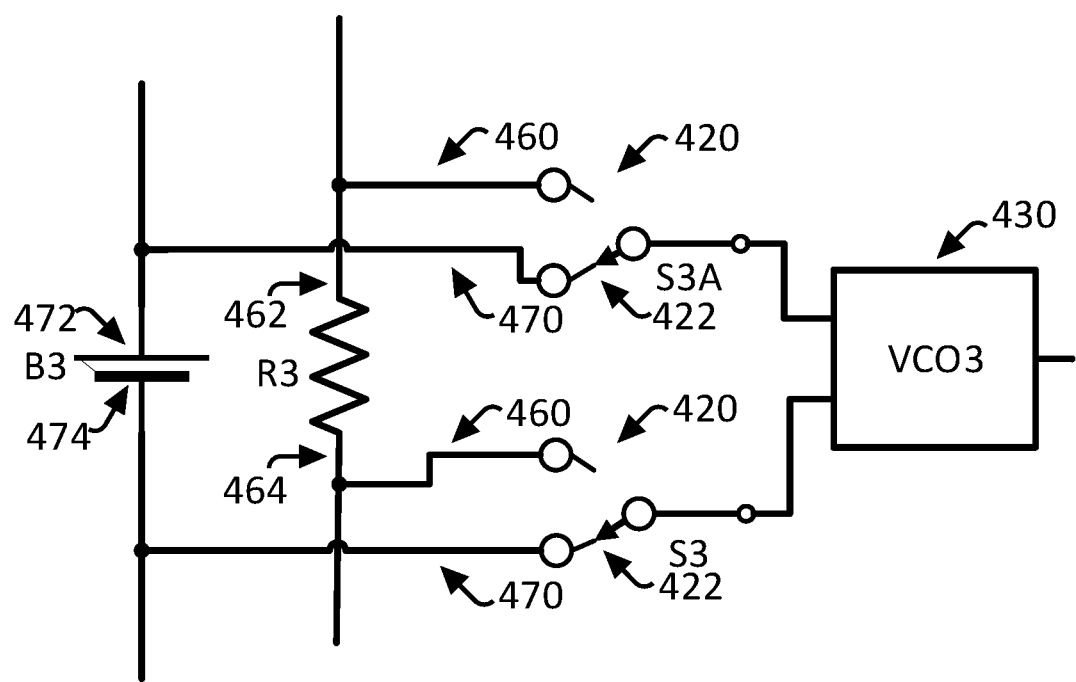
FIG. 6 is a schematic of a representative channel in the system of FIG. 4 with the switches in the second state.

The switches 420 have first and second states 421, 422. In the first state, 421, as illustrated in FIG. 5, the switches 420 electrically couple a resistor circuit 460 to a corresponding VCO 430. In general, there are n VCOs 430 and n resistor circuits 460. Each resistor circuit 460 extends across first and second sides 462, 464 of the corresponding resistor (e.g., R1, R2, R3, or R4) to measure its voltage (e.g., its resistor voltage). In the second state 422, as illustrated in FIG. 6, the switches 420 electrically couple a plurality of battery cell circuits 470 to a corresponding VCO. In general, there are n battery cell circuits 470. Each battery cell circuit 470 extends across first and second terminals 472, 474 of the corresponding battery cell (e.g., B1, B2, B3, or B4) to measure its voltage (e.g., its battery cell voltage).

FIG. 5 and FIG. 6 are enlarged views of a portion of system 40 to illustrate the resistor circuit 460 and battery cell circuit 470 with respect to representative battery cell B3, resistor R3, and switches S3 and S3A. FIG. 5 illustrates the switches S3 and S3A in the first state 421 and FIG. 6 illustrates the switches S3 and S3A in the second state 422.

Each VCO 430 converts its input voltage into an output signal having a frequency corresponding to its input voltage. A variation in the input voltage results in a corresponding variation in the frequency of the output signal. Thus, the VCOs 430 operate as a voltage sensor. For example, referring to FIG. 5, when the switches S3 and S3A are in the first state 421, VCO3 converts the resistor voltage of R3 into an output signal (e.g., a resistor frequency signal) having a frequency that corresponds to the resistor voltage of R3. When the switches S3 and S3A are in the second state 422, as illustrated in FIG. 6, VCO3 converts the battery cell voltage of B3 into an output signal (e.g., a battery cell frequency signal) having a frequency that corresponds to the battery cell voltage of B3.

The output signals of the VCOs 430 are level-shifted by digital level shifters 440 to a single point, where the output signals can be processed by the logic circuit 450. The logic circuit 450 can comprise an arithmetic logic unit (ALU), a microcontroller (MCU), a state machine, a digital machine, or other logic circuit.

Figure 7:
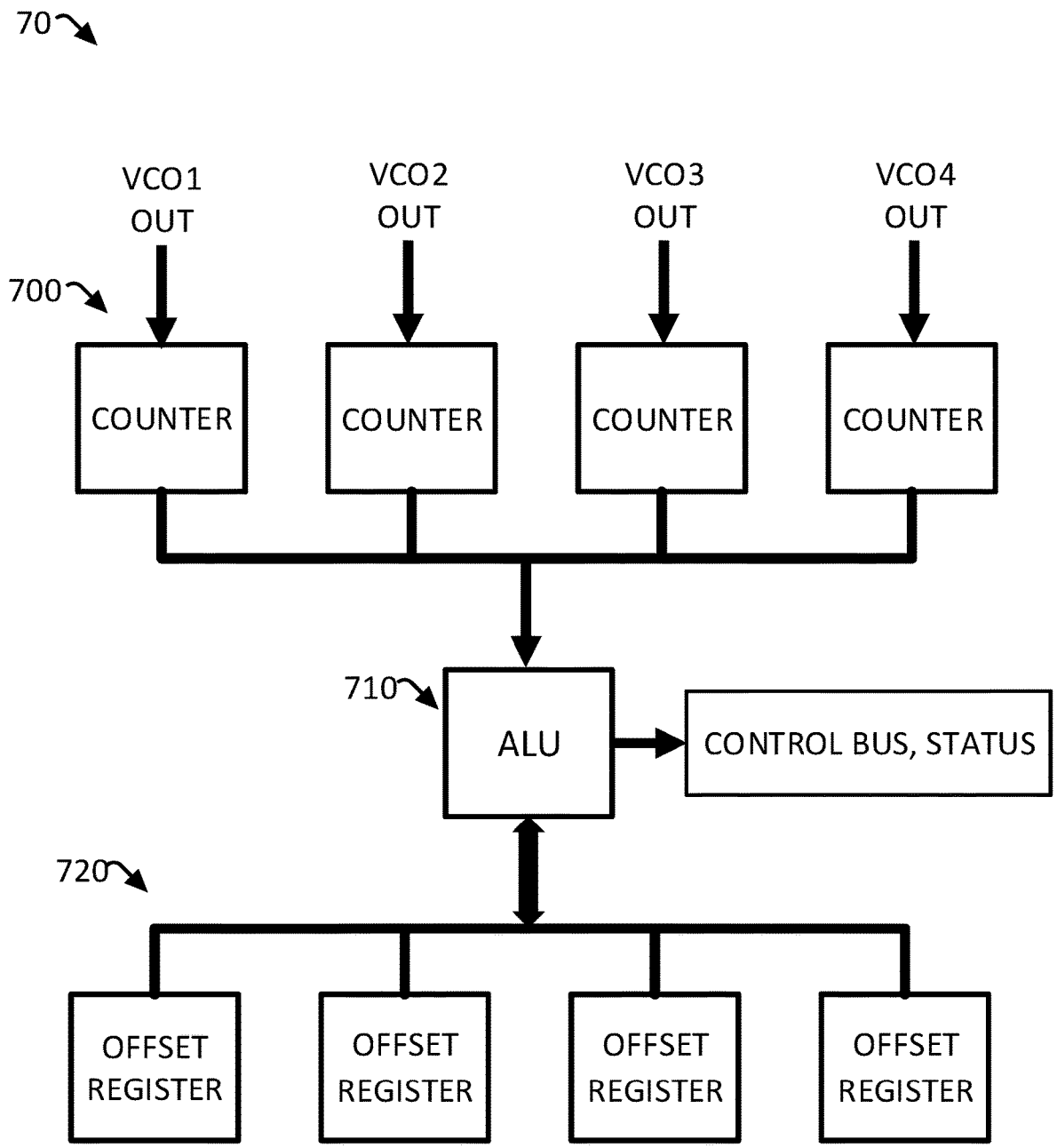
FIG. 7 is a block diagram of a logic circuit according to one or more embodiments.

FIG. 7 is a block diagram of a logic circuit 70 according to one or more embodiments. Logic circuit 70 can be the same as or different than logic circuit 450. Logic circuit 70 includes a plurality of counters 700, an ALU 710, and a memory circuit 720. In some embodiments, the ALU 710 can be replaced with a digital machine, a state machine, or a microcontroller.

Each counter 700 is electrically coupled to the output of a respective VCO 420 to receive its output signal (e.g., the resistor frequency signal or the battery cell frequency signal). The output of each counter 700 is electrically coupled to the input of the ALU 710, which is in electrical communication with the memory circuit 720. In operation, each counter 700 determines the total number of oscillations in the output signal from the corresponding VCO 420 over a predetermined time period, such as 1 millisecond. The ALU 710 controls the counters 700 and the length of the predetermined time period. The total number of oscillations measured by each counter 700 is a function of the frequency of the VCO 420 output signal. Thus, the total number of oscillations measured by each counter 700 corresponds to (e.g., is proportional to) the input voltage of the corresponding VCO 420, which is either the resistor voltage or the battery cell voltage depending on the state 421, 422 of the switches 420. The total number of oscillations measured by each counter 700 can also depend on any inaccuracies within the respective VCO 420.

After the counters 700 determine the total number of oscillations in the output signals from the VCOs 420, the ALU 710 compares the number of oscillations to determine the relative difference in the input voltages to the VCOs 420.

When the switches 420 are in the first state 421, the logic circuit 70 can calibrate the system 40. Since the voltage across each resistor R1-R4 is the same or substantially the same, any difference in the total number of oscillations that are measured by each counter 700 is due to inaccuracies in the VCOs 420. The ALU 710 can store these differences (e.g., offsets, calibration data, etc.) in the memory circuit 720, for example in a plurality of offset registers. The offsets can be calculated in a few different ways, such as the distance of each measured output (total number of oscillations over the predetermined time period) from the lowest or highest measured output amongst the group, or the distance of all the outputs from a fixed point, or from a random number. This is because in some embodiments the purpose of the system is to determine a relative measurement of the battery cell voltages to determine whether they are equal (or substantially equal such as within about 0.1% of each other and thus whether the battery cells B1-B4 are balanced. The actual or absolute battery cell voltages are not needed to determine whether they are equal or substantially equal to each other.

After calibration, the ALU 710 can then use the stored offsets when the switches 420 are in the second state 422 to determine the battery cell voltages and/or the balance of the battery cells B1-B4. The stored offsets can improve the accuracy of the system 40 including the VCOs 420, which can be less accurate than the ADCs used in existing systems.

In some embodiments, the actual or absolute battery cell voltages can also be determined by using a reference voltage. For example, the logic circuit 450 or 70 can determine the offsets with respect to a known reference voltage (Vref connected to VCO1 through S1 in FIG. 4) such that the reference for calibration is based on an accurate voltage measurement of at least one of the channels. Thus, at least one of the switches 420 (e.g., S1) can have a third state to determine a reference voltage Vref, which can be used to as a reference point for determining the offsets when the switches are in the first state 421, as discussed above.

In some embodiments, the reference voltage can be equal to an absolute maximum safe battery cell voltage to help monitor and prevent each battery cell voltage from exceeding a safe level when charging. The Vref shown in FIG. 4 can be replicated for each channel, such that each VCO 420 (VCO1-VCO4) can have its own accurate reference voltage (Vref1-Vref4), as illustrated in system 80 in FIG. 8. System 80 is otherwise the same as system 40.

The reference voltages in system 80 can provide a means for monitoring each battery cell B1-B4 for its maximum charge voltage, even if the VCOs 420 are nonlinear, have different offsets, different temperature coefficients, and gain slope variations, as each battery cell B1-B4 and VCO 420 can be frequently calibrated against a known reference voltage, Vref(n). Likewise over-discharge can be prevented by using reference voltage(s) to accurately detect the actual or absolute battery cell voltage and prevent from over-discharge beyond a safe point.

Furthermore, using one or more accurate reference voltages for calibration and setting the threshold for overcharge and/or over-discharge, will also allow reasonably-accurate measurement of the battery cell voltage at any point, either through interpolation, which can be based on the battery cell voltage measurement using calibration, accurate reference voltage(s), and offset cancellation described above, or by assuring that the VCOs 420 (or ADCs, as discussed below) are linear and have reasonably-matched gains, when using accurate reference(s) with only one of the VCOs. In an aspect, the circuit can cause a shift in all measurements that is achieved through use of an offset. In another aspect, the circuit can correct gain errors using calibration. When all VCOs (or ADCs) have their own accurate reference, only offset cancellation is needed to provide reasonably-accurate battery cell voltage measurement, potentially used for determining the remaining charge in the battery and other telemetry needs. If the references are solely used for providing the upper and lower thresholds, the offsets are not need to be calculated or used.

Another possible measurement using this system could be to use temperature sensors for every battery cell or one for the whole multicell battery. This input to the VCO(s) (or ADCs, as discussed below) could also be calibrated using methods already described above. It should be clear that once we have a system as described, which can perform self-calibration, it can be used to measure any input voltage relatively accurately. This could include the voltage output of temperature sensors or other voltages. If temperature sensors are used, this circuit can also prevent overheating and provide means to cut off the battery from its terminals as needed. Such circuits are commonly used and understood.

Figure 9:
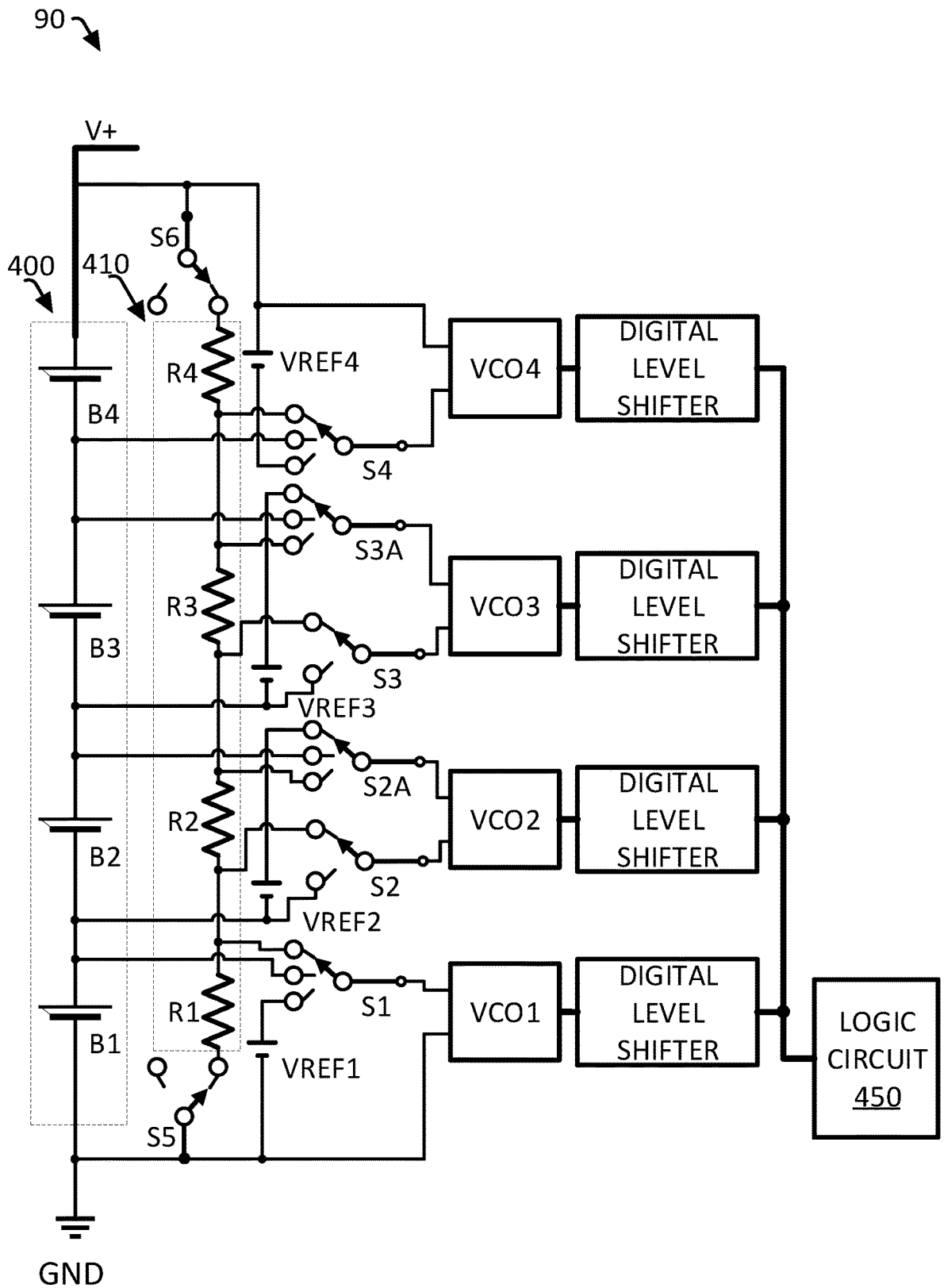
FIG. 9 is a schematic of a system for measuring the voltage across each cell of a multicell battery prior to charge balancing according to one or more embodiments.

FIG. 9 is a schematic of a system 90 for measuring the voltage across each cell of a multicell battery prior to charge balancing according to one or more embodiments. System 90 is the same as system 40 with the addition of switches S5 and S6 to disconnect the resistor ladder 410 when not in use to reduce the current leakage from the multicell battery 400. These switches can be put in various places to open the leakage path.

Figure 10:
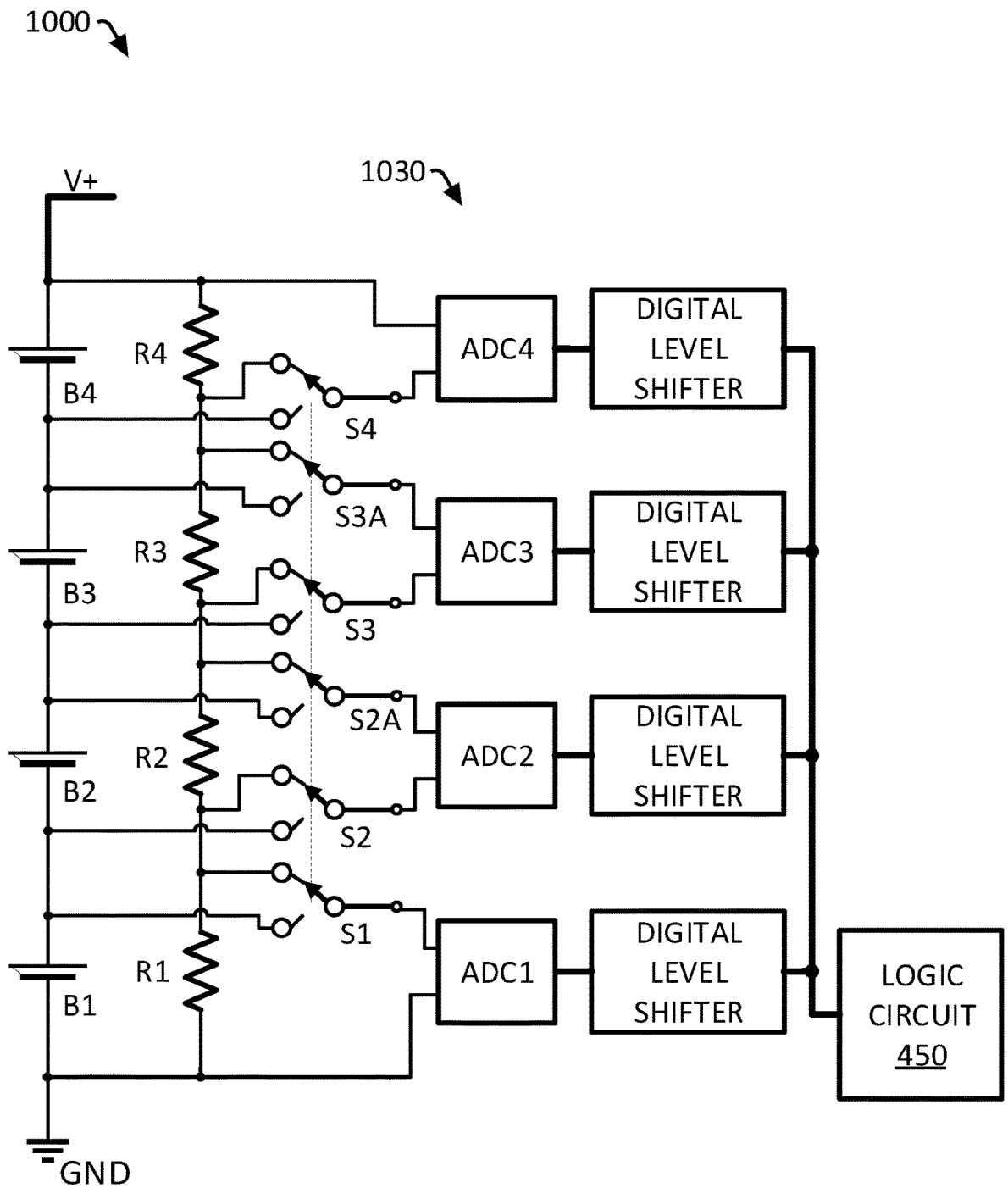
FIG. 10 is a schematic of a system for measuring the voltage across each cell of a multicell battery prior to charge balancing according to an alternative embodiment.

FIG. 10 is a schematic of a system 1000 for measuring the voltage across each cell of a multicell battery prior to charge balancing according to an alternative embodiment. System 1000 is the same as system 40 with the exception that system 1000 uses ADCs 1030 instead of VCOs 430. The ADCs 1030 function as voltage sensors in a similar way to the VCOs 430. The output of each ADC 1030 is a digitally-encoded value of the input voltage. The calibration method described above can also be implemented with the ADCs 1030 in system 1000, which removes the need for highly-accurate ADCs in existing systems. In system 1000, even inaccurate and untrimmed ADCs can result in accurate measurements and monitoring of battery cells.

Figure 8:
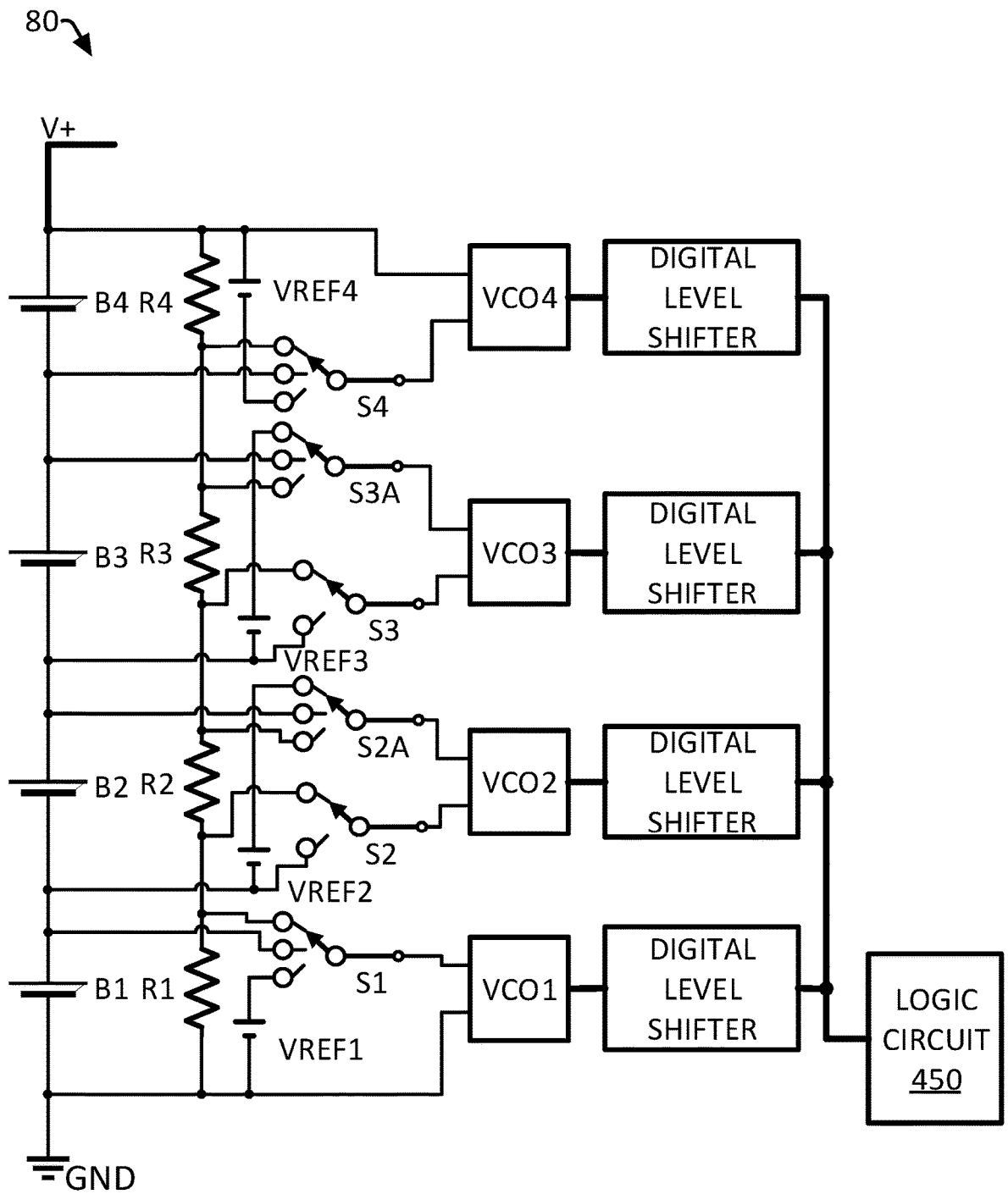
FIG. 8 is a schematic of a system for measuring the voltage across each cell of a multicell battery prior to charge balancing according to one or more embodiments.
Figure 11:
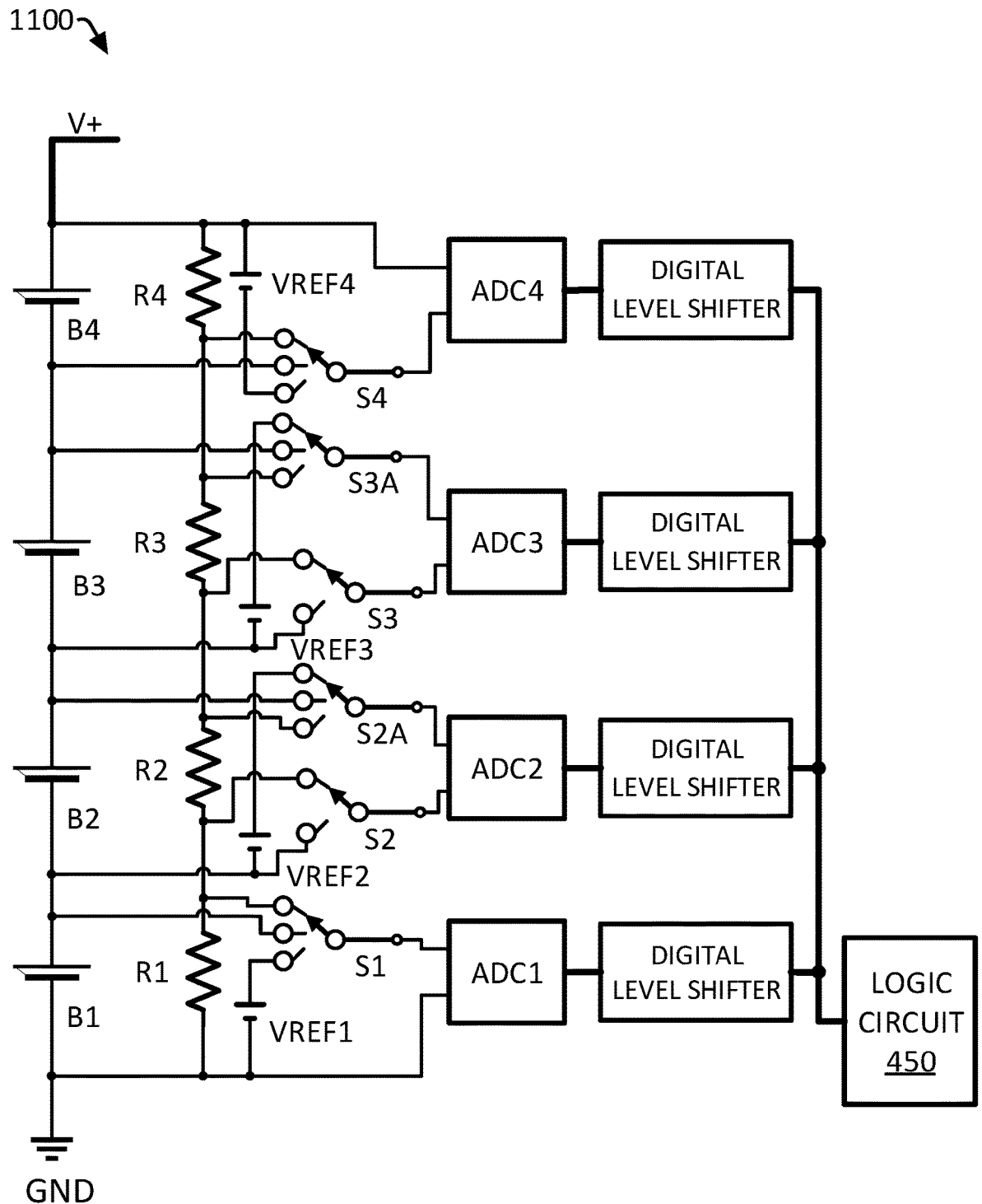
FIG. 11 is a schematic of a system for measuring the voltage across each cell of a multicell battery prior to charge balancing according to one or more embodiments.
Figure 12:
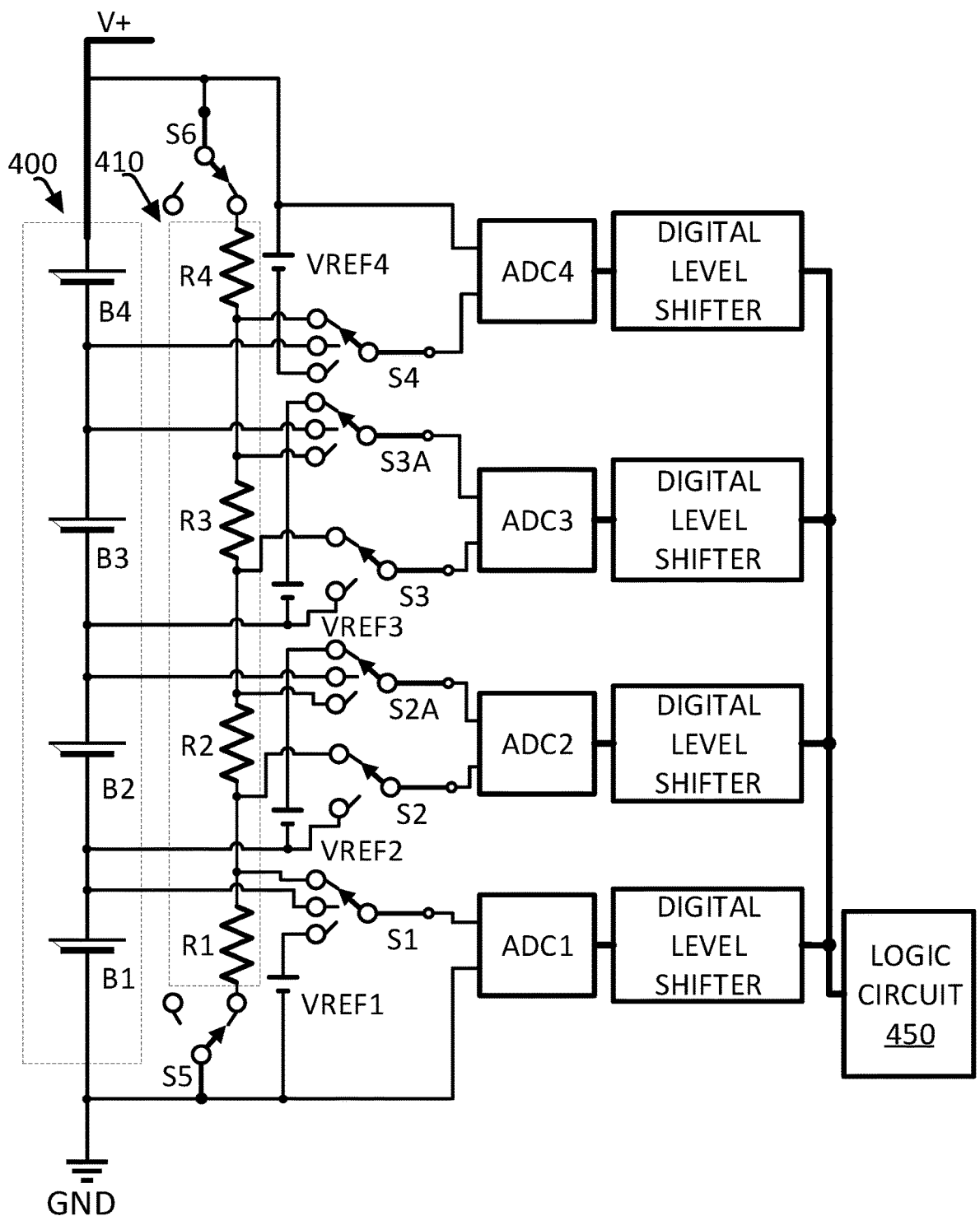
FIG. 12 is a schematic of a system for measuring the voltage across each cell of a multicell battery prior to charge balancing according to one or more embodiments.

The alternative embodiments illustrated in FIGS. 8 and 9 (e.g., reference voltages for at least one VCO 420 and additional switches to disconnect the resistor ladder 410) also apply to system 1000, as illustrated in FIG. 11 and FIG. 12, respectively. The description of FIGS. 8 and 9 also applies to FIGS. 11 and 12, respectively.

Figure 13:
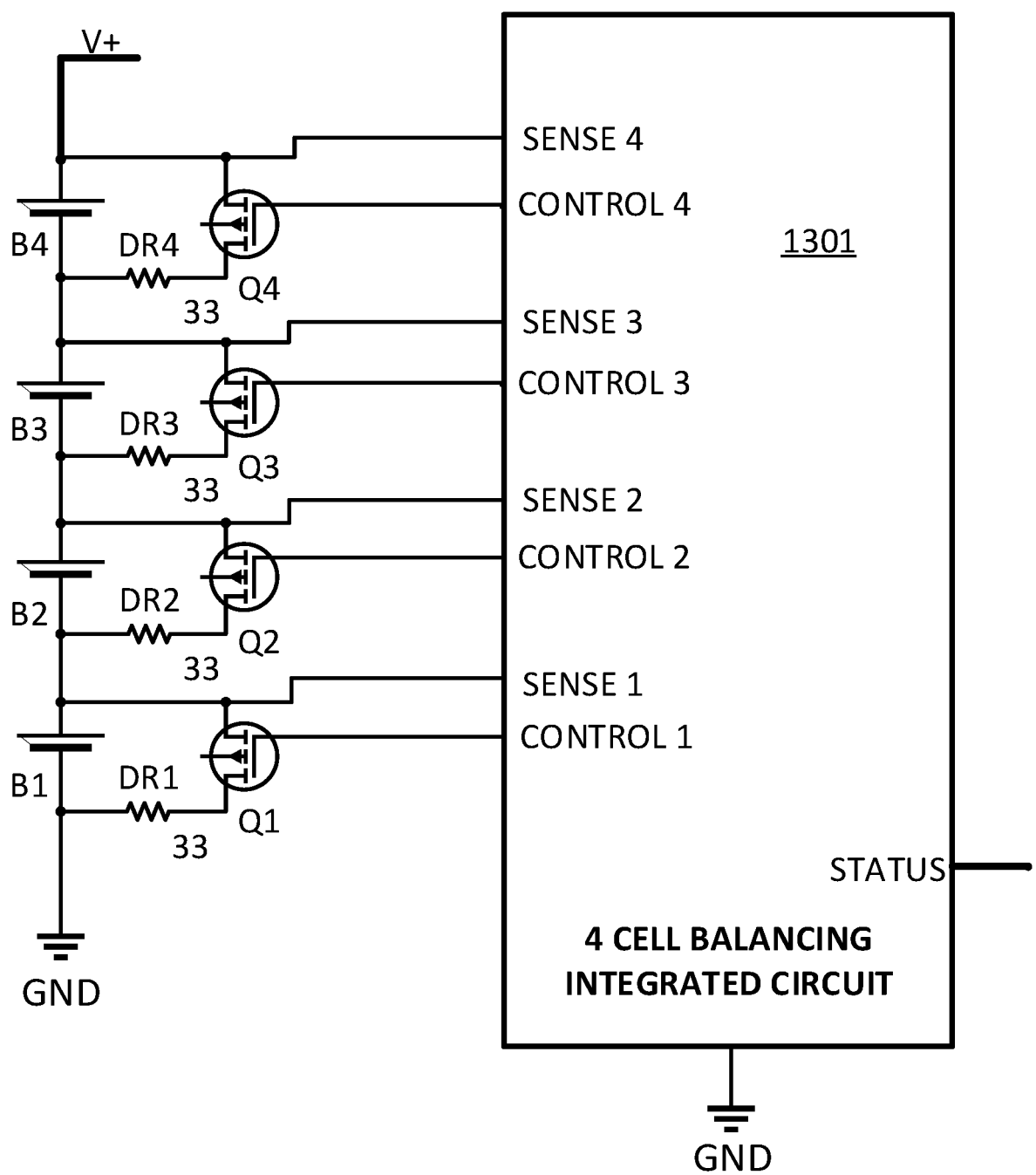
FIG. 13 is a block diagram of a system to illustrate how one or more embodiments described herein can be integrated into a single integrated circuit.

FIG. 13 is a block diagram of a system 1300 to illustrate how one or more embodiments described herein can be integrated into a single integrated circuit (IC) 1301 or onto more than one IC. In an example, IC 1301 includes the resistor ladder 410, the switches 420, the VCOs 430 and/or ADCs 1030, the digital level shifters 440, and the logic circuit 450, 70 described above. Discharge switches Q1, Q2, Q3 and Q4 are used to lower the voltage on selected cells or to selectively dump charge therefrom. The discharge switches are actuated by the present control circuit that is configured and arranged to turn the discharge switches on (or off) for certain periods of time during cell balancing. In the illustrated example, the discharge switches are controlled by IC 1301 to discharge the battery cells B1-B4 with higher that the lowest battery cell voltage to force all the battery cells to be nearly equal. In one example, the cell voltages are brought or kept within one percent (1%) of each other. In another example, the cell voltages are brought or kept within a tenth of a percent (0.1%) of each other. Note that Q1-Q4 can be integrated in the IC 1301 as well, but it is more common to keep them out as discrete components. The values of discharge resistors DR1, DR2, DR3 and DR4 are set to control the discharge rate of the respective battery cells. It is noted that IC 1301 can have additional or fewer sense and control circuits. Those skilled in the art will understand that the present circuits can be implemented in a number of acceptable ways without departing from the spirit of the invention. Specifically, the illustrated circuits can incorporate some or all of the present components on a same integrated circuit (IC), or can distribute the components on several different circuits so as to have a multi-IC implementation.

Figure 14:
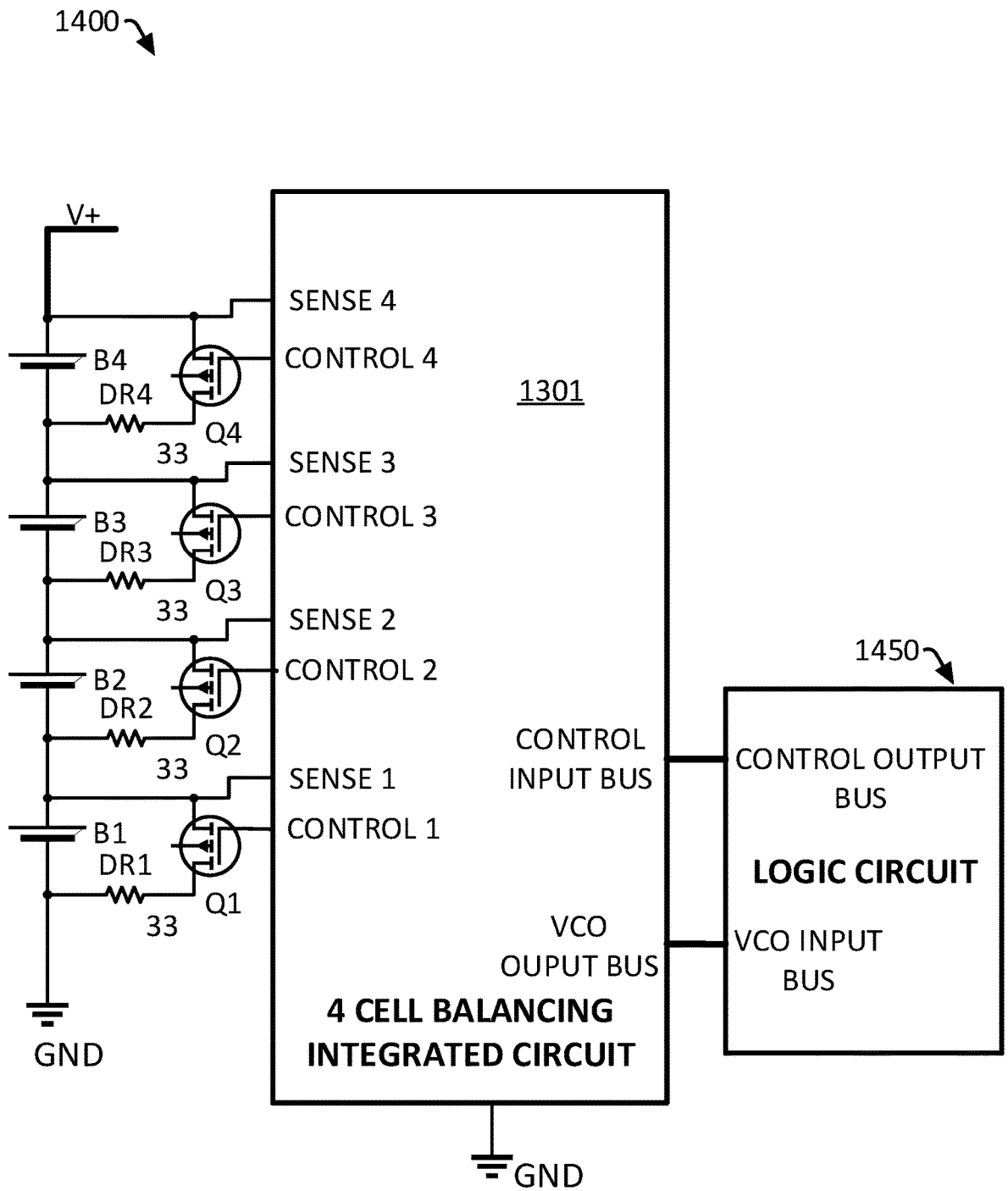
FIG. 14 is a block diagram of a system which is an alternative embodiment of the system illustrated in FIG. 13.

FIG. 14 is a block diagram of a system 1400 which is an alternative embodiment of system 1300. In system 1400, the logic circuit 1450 is not integrated in the IC and is kept separate for flexibility. For example, the logic circuit 1450 can be customized by the user. Otherwise, system 1400 is the same as system 1300. Digital logic 1450 can be the same as or different than digital logic 450 and/or 70.

Figure 15:
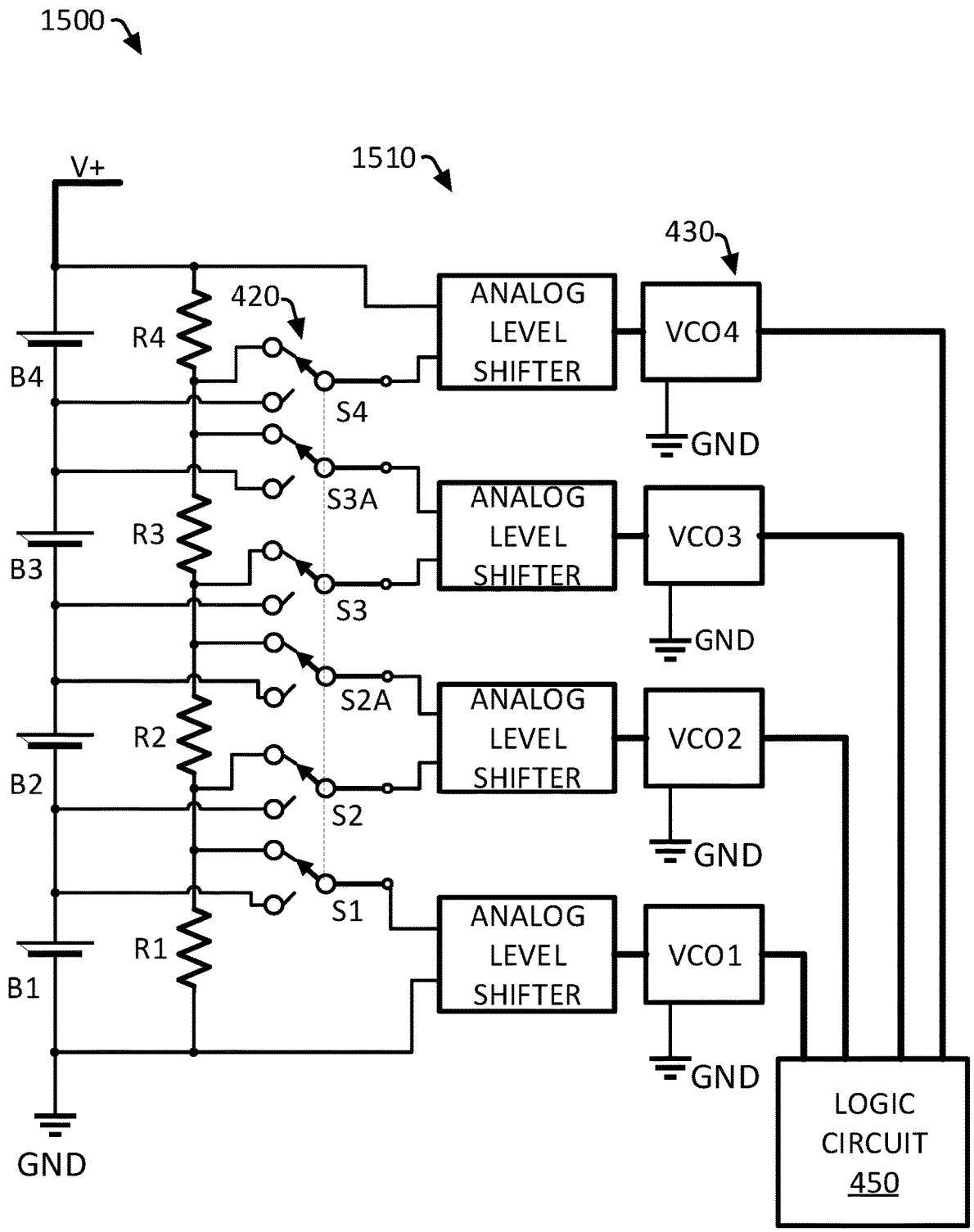
FIG. 15 is a schematic of an alternative embodiment of a system for measuring the voltage across each cell of a multicell battery prior to charge balancing.

FIG. 15 is a schematic of an alternative embodiment of a system 1500 for measuring the voltage across each cell of a multicell battery prior to charge balancing. System 1500 is the same as system 40 except that analog level shifters 1510 are electrically disposed between the switches 420 and the VCOs 430 and the digital level shifters 440 in system 40 are removed. The analog level shifters 1510 are used to bring all the battery cell voltages to a common node, such as the ground where all the VCOs 430 are referenced and the VCO 430 outputs then can connect to the logic circuit 450. This scheme will also correct for the analog level shifter 1510 inaccuracies through calibration, for example similar to correcting for VCO or ADC inaccuracies as discussed above. In some embodiments, some or all of the VCOs 430 in FIG. 15 can be replaced by ADCs.

Figure 16A:
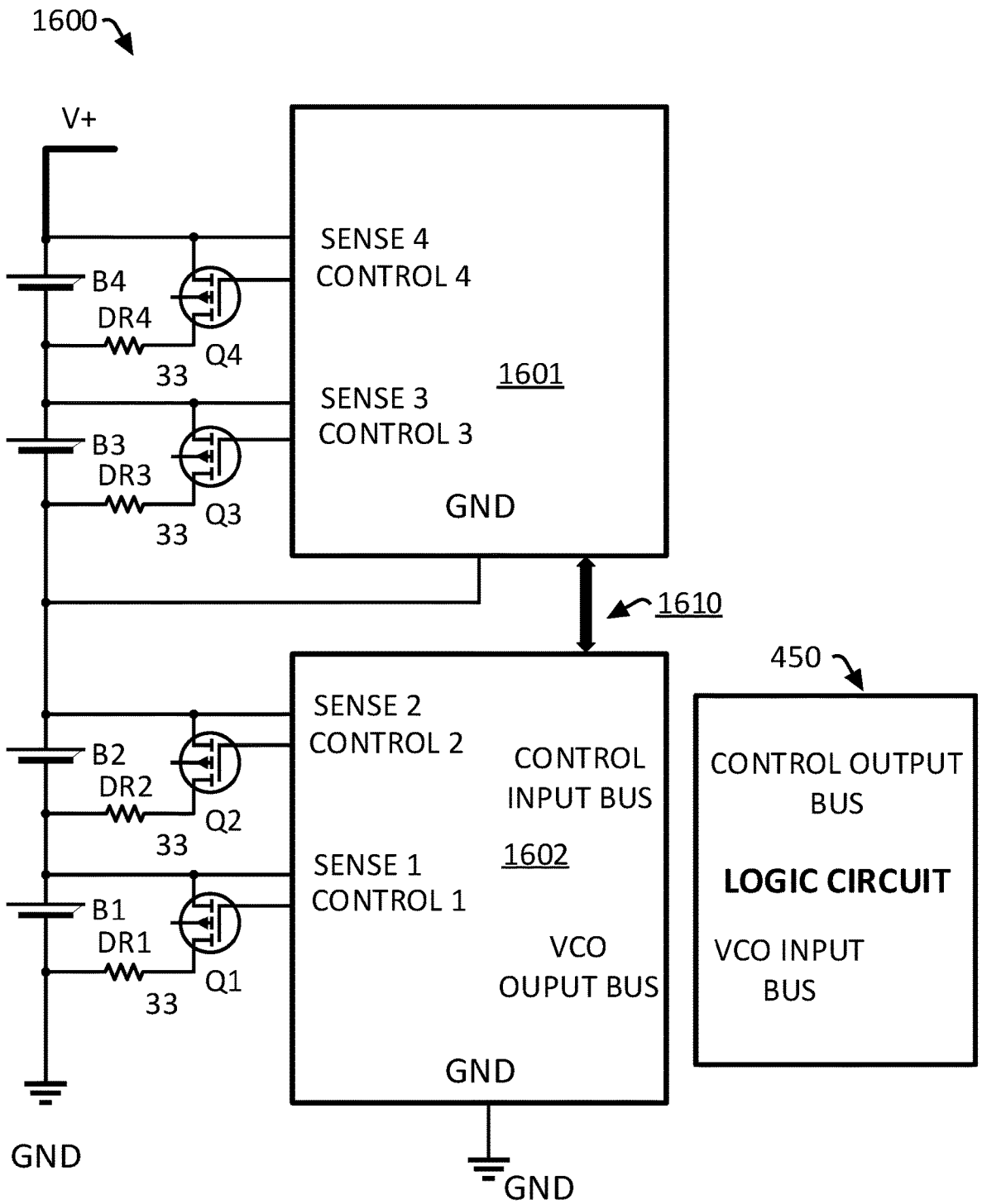
FIG. 16A is a schematic of an embodiment of a system in a cascade form, where ICs with limited battery cell inputs can be stacked to manage and work with higher number of battery cells possible than with an individual IC.

FIG. 16A is a schematic of an embodiment of a system 1600 in a cascade form, where the ICs 1601, 1602 with limited battery cell inputs can be stacked to manage and work with higher number of battery cells possible than with an individual IC. The level shifters are made such that the top IC 1601 will pass the data to its neighbor IC 1602 through serial connection(s) 1610. The data from both ICs 1601, 1602 are then combined and transferred to digital logic 450 for the final reading, correction/calibration, and use. ICs 1601, 1602 can be the same as IC 1301. It is noted that ICs 1601 and/or 1602 can have additional or fewer sense and control circuits to interface with additional or fewer battery cells, respectively. Additionally, communication port 1610 may be used to deliver an output to the upper ICs in the drawing to control the discharge switch and other control signals and internal switching. In this configuration it is possible to overlap the top battery cell of the bottom IC with the lower battery cell of top IC, such that one battery is commonly shared. This can be the link that enables more accurate balancing, as top and bottom ICs will have to force all the other cells to match this commonly shared battery cell. A plurality of separate integrated circuits can thus collaboratively manage the charging, discharging or balancing of a multi-cell architecture whereby two or more ICs can charge or discharge or balance a shared battery cell member.

Figure 16B:
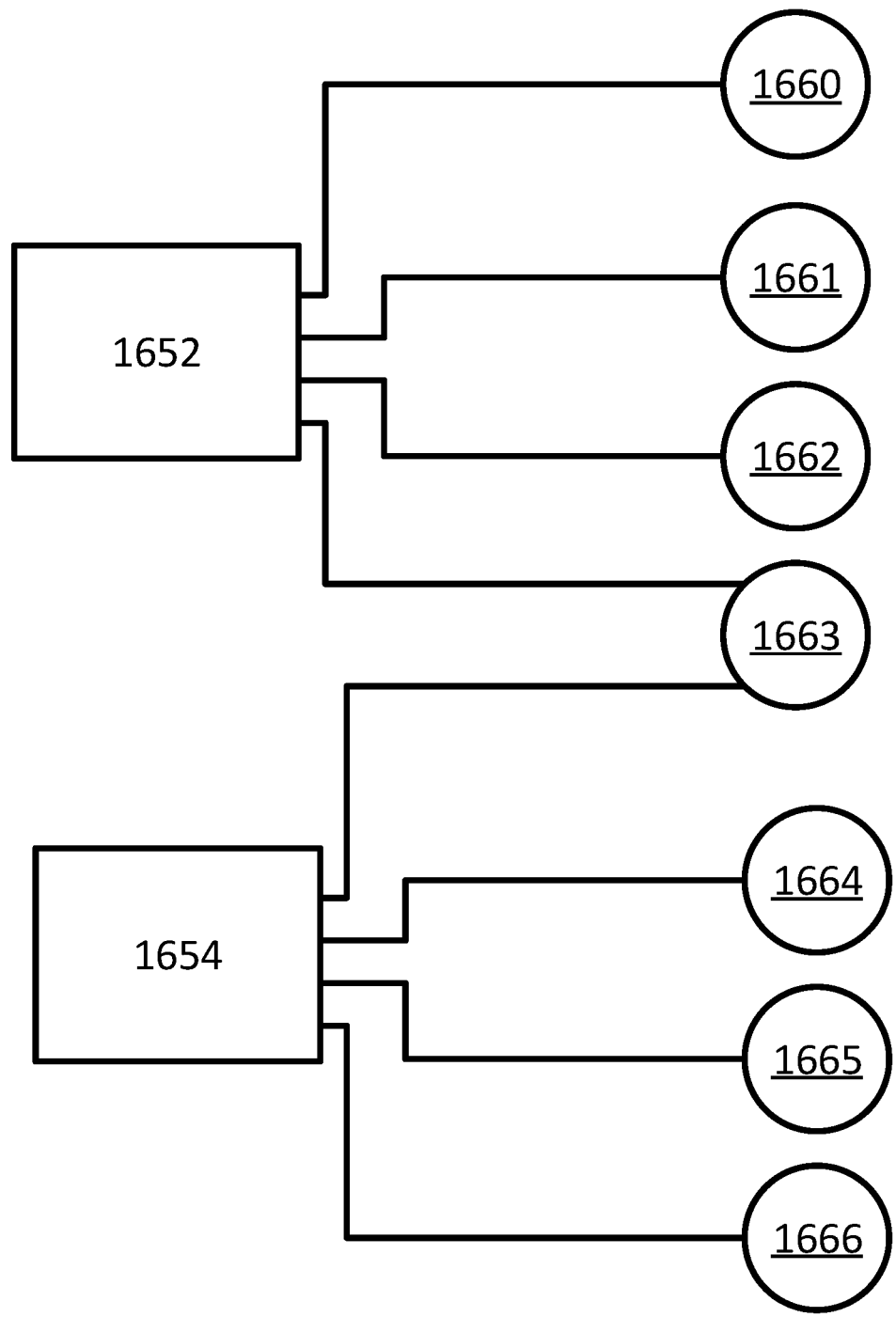
FIG. 16B represents cell management or balancing ICs having at least one common cell being managed or balanced.

FIG. 16B illustrates an embodiment having two ICs 1652, 1654, e.g., one on top of the other as a top IC and bottom IC respectively. This can be generalized to multiple ICs and they can be arranged and configured however those skilled in the art see appropriate. The two ICs 1652, 1654 can each manage or balance a plurality of cells (for example, three cells). In the example, IC 1652 is configured and arranged to manage cells 1660 through 1663 and IC 1654 is configured and arranged to manage cells 1663 through 1666. Note that cell 1663 in the example can be managed by both ICs 1652 or 1654. We see that a common or shared battery cell can be coupled to both ICs for the purpose of balancing the same. In an aspect, a common discharge switch can be controlled by the plurality of ICs so as to control, manage or balance a common cell or set of cells. Again, those skilled in the art will appreciate that several shared cells can be managed by two or more ICs without loss of generality.

Figure 17:
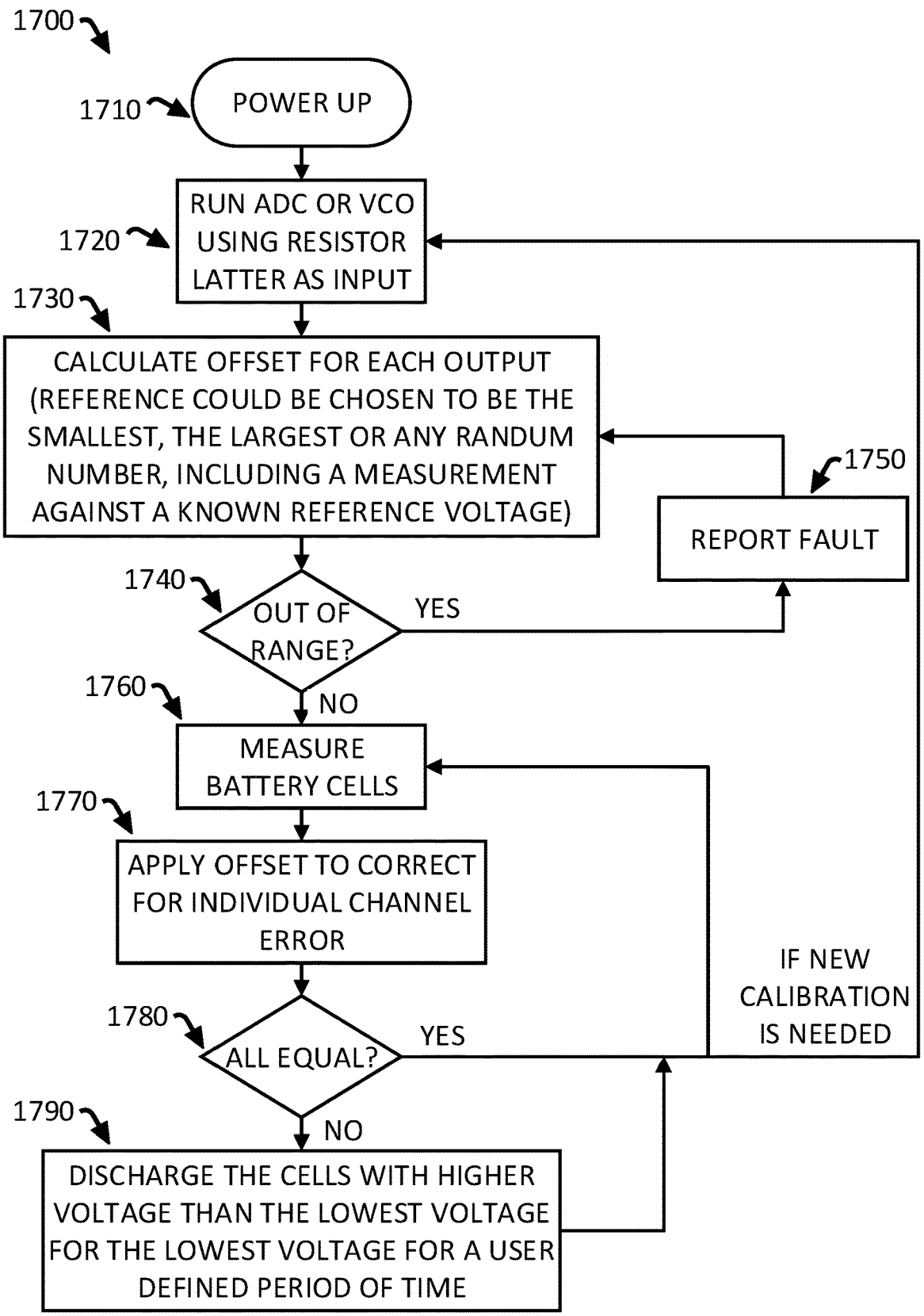
FIG. 17 is a flow chart for balancing battery cells in a multicell battery according to one or more embodiments.

FIG. 17 is a flow chart 1700 for balancing battery cells in a multicell battery according to one or more embodiments. In step 1710, the multicell battery and the control system (e.g., system 40) are powered up. In step 1720, the voltage sensors (e.g., ADCs or VCOs) are operated with the switches in the first state to perform a self-calibration. The resistor voltages across the identical resistors in the resistor ladder are measured to determine any error or inaccuracies in the ADCs or VCOs. This step includes using counters to determine the total number of oscillations, over a predetermined time period, in the output signal from each VCO, or alternatively, registers that hold the output of each ADC. In step 1730, the offset for each output signal and channel is determined. The offset can be with respect to the smallest total number of oscillations, the largest total number of oscillations, a random number, or the total number of oscillations from a known reference voltage. The offsets are stored in memory, such as an offset register. Again, the VCO and ADC implementations vary somewhat, but generally these components act responsively to a sensed voltage with the VCO outputting a countable oscillation and the ADC outputting a determinable ADC output signal corresponding to the sensed voltage.

In step 1740, the system determines whether the offsets are out of a predefined range, which may indicate an error in the measurement. If so, a fault is reported (e.g., on a user interface) in step 1750 and the flow chart returns to step 1740 to re-calculate the offsets. If the offsets are within the predefined range, the flow chart 1700 proceeds to step 1760. In step 1760, the switches are operated in the second state to measure the battery cell voltage across each battery cell, for example by counting the total number of oscillations over a predetermined time period, in the output signal from each VCO or ADC.

In step 1770, the stored offsets are applied to correct for errors or inaccuracies in the ADCs or VCOs. In step 1780, the system determines whether the total number of oscillations calculated in each channel (e.g., for each VCO output) is equal or substantially equal to one another. If so, the flow chart 1700 returns to step 1760 to re-measure the battery cell voltages. However, if a new calibration is needed, which may be based on the time elapsed since the last calibration and/or other factors, the flow chart 1700 returns to step 1720 to re-calibrate the ADCs or VCOs. If the total number of oscillations in at least one of the channels is not equal to the others, in step 1790 the system discharges the battery cells that have a relatively higher voltage (e.g., higher total number of oscillations) than the lowest-voltage battery cell for a time period, which can be defined by the user. After the appropriate battery cells have been discharged, the flow chart 1700 returns to step 1760 or 1720, as discussed above.

We can also employ one or more discharge algorithms in the present system and method. For example, we can simultaneously discharge all of the cells having a voltage greater than the lowest cell voltage. In another example, we can discharge one cell at a time in a chosen configuration or in a given order. Those skilled in the art will appreciate other alternate ways for selectively discharging a subset of the cells in the multi-cell battery as suits a given application. A machine learning engine or method can be used to optimize the specific cell charging, discharging and/or balancing process described above. Any suitable computer processor or data store can be programmed with historical data relevant to the electrical, thermal, chemical or other parameters affecting battery cell management and monitoring.

In some aspects, a voltage and voltage threshold are used to control cell charging and balancing. In another aspect, a temperature and temperature threshold are used to control cell charging and balancing. For example, some embodiments provide a controllable or switched discharge of cells measured to be at a predefined threshold. This can be repeated in the plurality of battery cells until the cells are substantially uniformly charged or balanced.

The offset calculation mentioned herein is optional to some embodiments. In other words, the offset calculation can be omitted in some embodiments, and battery cell voltage is simply compared to the resistor voltage, which represents a target voltage in a balanced multicell pack. If the battery voltage is above this ideal voltage, the system will force a discharge until a given cell voltage approximates a target voltage or the ideal cell voltage. By repeatedly applying this step, eventually all battery cells will have the target voltage or will have nearly equal voltages and be balanced.

Figure 18:
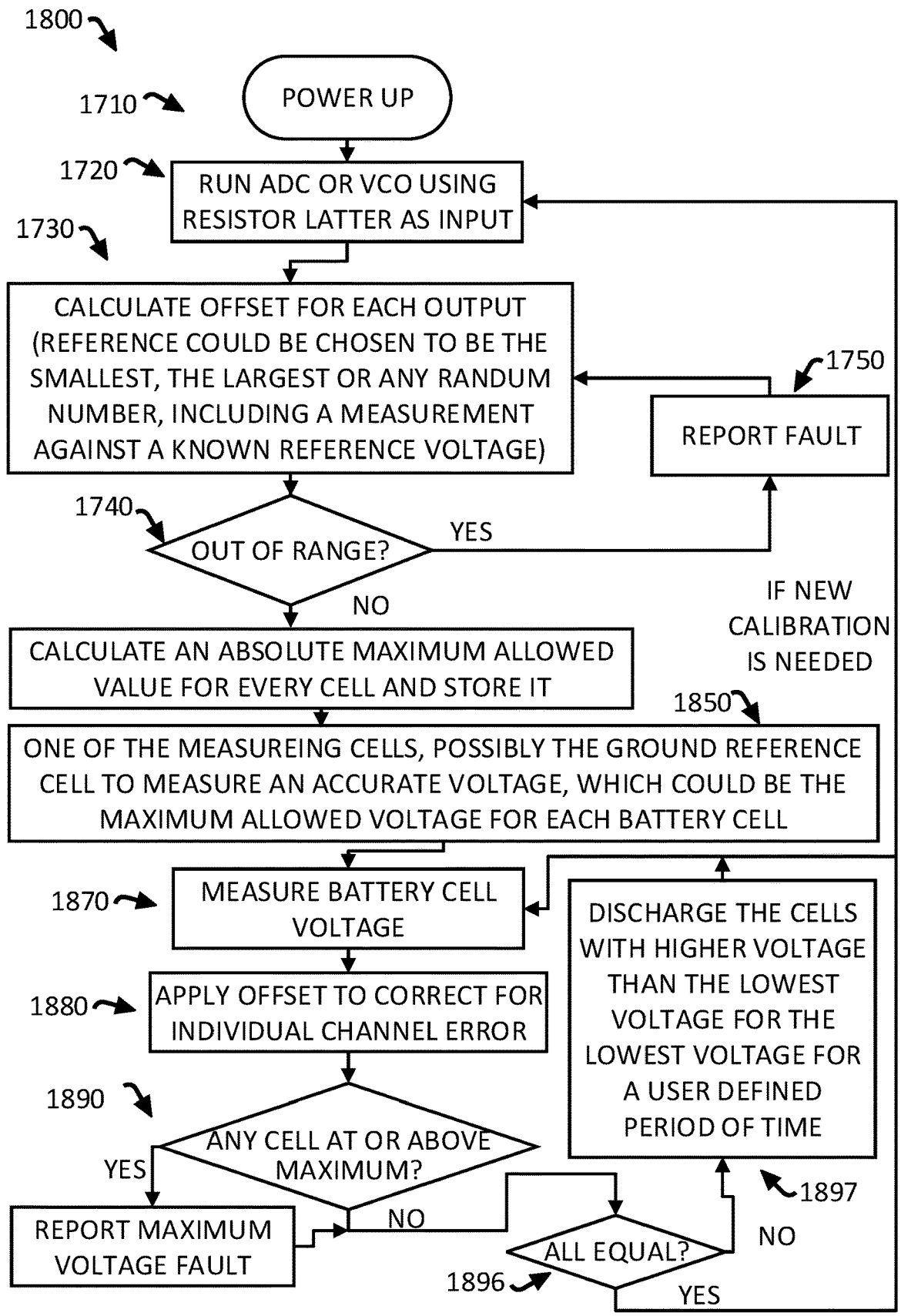
FIG. 18 is a flow chart for balancing battery cells in a multicell battery according to one or more embodiments.

FIG. 18 is a flow chart 1800 for balancing battery cells in a multicell battery according to one or more embodiments. Flow chart 1800 includes steps 1710-1750, which are the same as described above in flow chart 1700. In step 1850, the system measures a known reference voltage in at least one cell. For example, the switches for at least one voltage sensor (e.g., VCO or ADC) can be operated in the third state to measure a known reference voltage, as discussed above. In step 1860, the system uses the measurement of the known reference voltage (e.g., the total number of oscillations of the output signal over a predetermined time period) to determine an absolute maximum allowed value (e.g., maximum total number of oscillations of the output signal over the predetermined time period) for each battery cell, which corresponds to the maximum allowed battery cell voltage for each battery cell. The absolute maximum allowed values are stored in memory.

In step 1870, the battery cell voltages are measured (e.g., with the switches in the second state). Step 1870 can be the same as step 1760. In step 1880, the stored offset (from step 1730) is applied to correct for errors or inaccuracies in the ADCs or VCOs. Step 1880 can be the same as step 1770. In step 1890, the system determines whether the measured battery cell voltage of any battery cell is greater than the maximum allowed battery cell voltage (e.g., the values stored in step 1860). If so, in step 1895 the system reports a maximum battery cell voltage fault such as on a user display. If not or after step 1895, the system determines the total number of oscillations calculated in each channel (e.g., for each ADC or VCO output) is equal or substantially equal to one another in step 1896, for example as described above in step 1780. If so, in step 1897 the system discharges the battery cells that have a relatively higher voltage than the lowest-voltage cell for a period of time, which can be set by the user. If not or after step 1897, the system returns to step 1870 to re-measure the battery cell voltages. However, if a new calibration is needed, which may be based on the time elapsed since the last calibration and/or other factors, the flow chart 1800 returns to step 1720 to re-calibrate the ADCs or VCOs.

The disclosure and claims presented here are directed to systems and methods for calibrating through forced balancing of multi-cell batteries so that the multiple cells in series each have a same or substantially the same voltage, within the accuracy of certain components used in the invention, e.g., within the discriminatory tolerances of the above digital and/or analog parts.

Those skilled in the art might recognize that traditionally detecting maximum or minimum reference voltages to balance cells could require costly components. Also, such systems might be temperature-dependent (having temperature coefficients) that reduce their accuracy. In an aspect, the present inventor describes a method for calibration with a calibration engine that provides a calibrated reference for detecting such maximum and minimum cell voltages without using a physical voltage reference circuit.

By way of example but not limitation, consider a typical upper threshold of a Lithium Ion battery before it is damaged, which is around 4.2V. This value may vary depending on the exact chemistry and manufacturing process. The cell typically also has a lower threshold before damage that is around 2.5V. If temperature was not a factor, it may be possible to apply 4.2V to every channel, record what the output is in a nonvolatile memory, and use that number as a reference to detect when the battery voltage is above 4.2 or below 2.5V. In one or more embodiments, the present system and method may employ a temperature sensor to provide a temperature reference and correct for errors introduced by temperature changes. This temperature measurement does not need to be exact, and it is only used as a relative temperature and a reference when doing the interpolation. In other embodiments, no temperature compensation is required.

Figure 19:
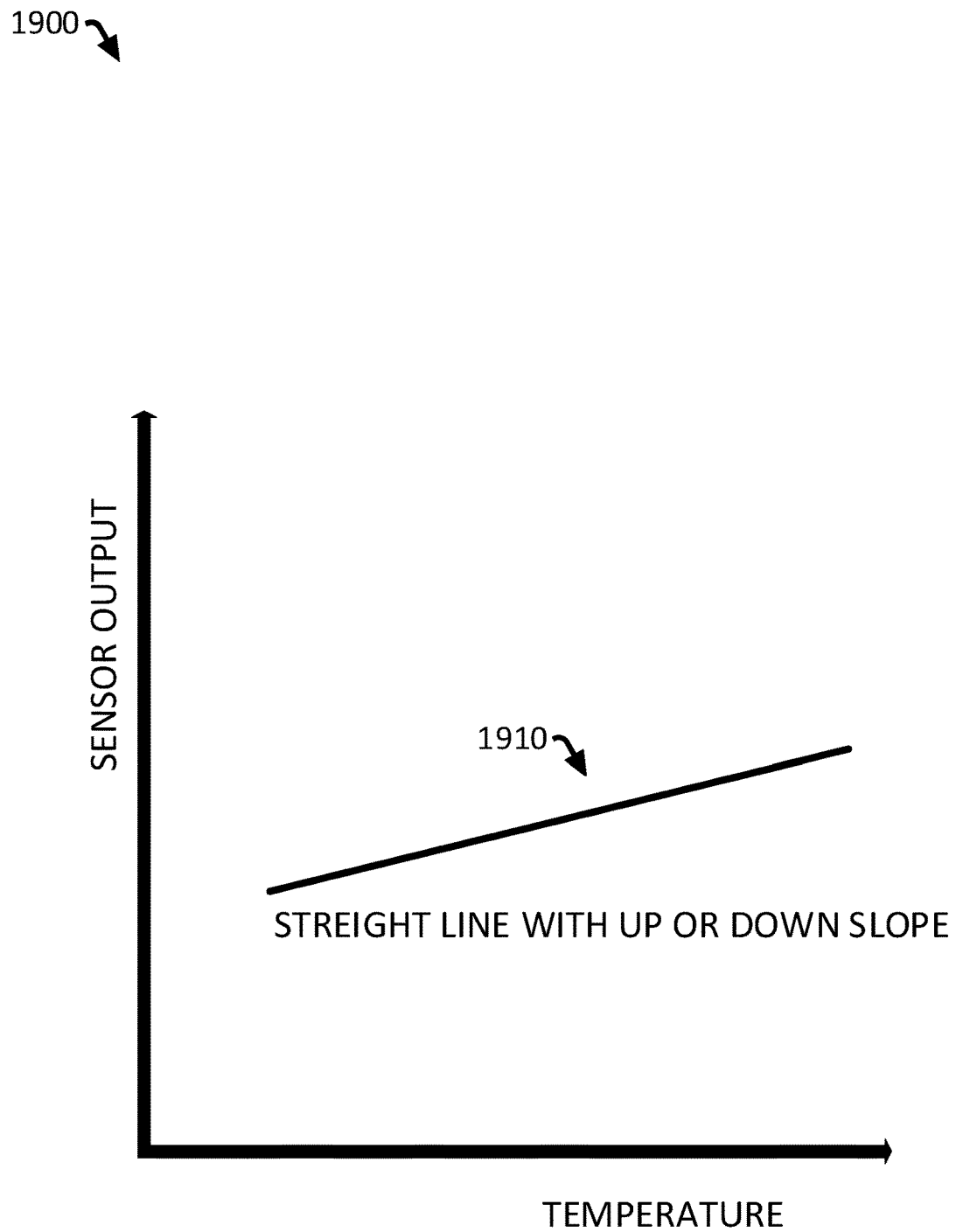
FIG. 19 illustrates a characteristic sensor output versus temperature curve.

FIG. 19 illustrates a characteristic 1900 showing an output of a temperature sensor versus temperature, which is preferably linear in its response, or substantially linear within a temperature range of interest. Therefore, the output of the temperature sensor versus its temperature will be or approximate a straight line 1910 as shown. By using the same VCO or ADC circuit already discussed, the output of the temperature sensor can also be digitized and recorded. If during the manufacturing test we apply a first temperature and record the result in a nonvolatile memory, and then apply a second temperature and record that in nonvolatile memory, a slope of the line can be calculated and interpolation can be performed to find any point on this line. Using the same method, the voltage detectors (VCOs and or ADCs) can measure a known voltage, say 4.2V at those same two exact temperatures and the results can be recorded in the nonvolatile memory. A line can also be drawn between those two measurements, which also would show this slope vs. temperature. This circuit should also be designed such that the output of the voltage measurement circuit is also near linear.

Figure 20:
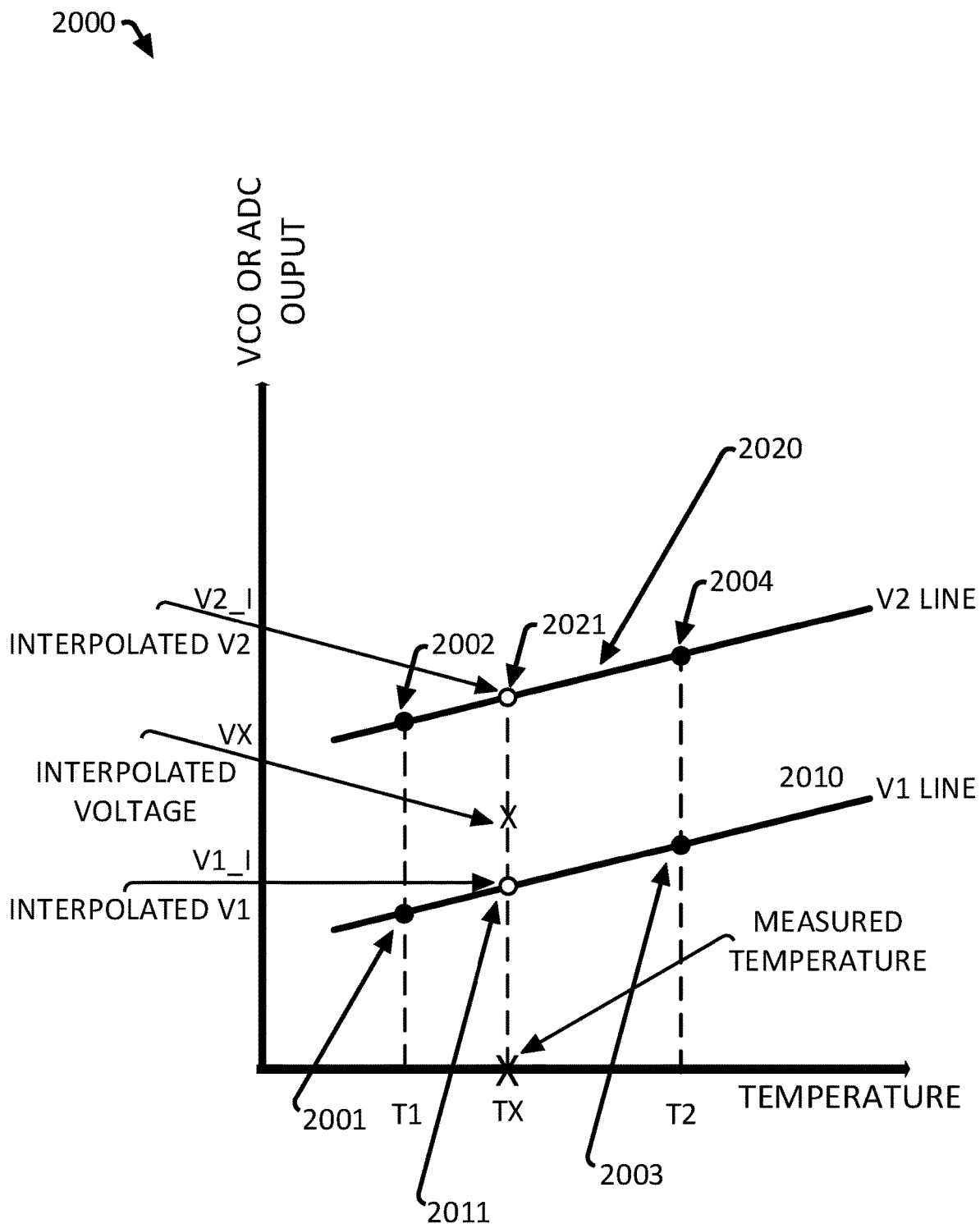
FIG. 20 illustrates a corresponding VCO or ADC output versus temperature corresponding to that of FIG. 19.

FIG. 20 illustrates exemplary interpolation plots 2000 for more accurate accounting of the temperature effects on an electrical measured quantity such as voltage or current output of a temperature-dependent sensor. The temperature is depicted on the horizontal axis and the electrical quantity (voltage or current) is depicted on the vertical axis. During the final steps of manufacture of the product, we apply two known voltages at two known temperatures. For example, using a known voltage and temperature reading at the manufacturing site, we plot known voltage V1 at the known first known temperature (2001) and this same voltage V1 at the second known temperature T2 (2003). Likewise, we plot the second known voltage V2 at the same first known temperature T1 (2002) and at the same second known temperature T2 (2004). This set of points are trusted and can be used to create a first characteristic line 2010 for V1 and a second characteristic line 2020 for V2 as shown. Now, once the device is in the field (in use in a product) we can use the two trusted characteristic lines 2010 and 2020 to interpolate a temperature-dependent electrical quantity (e.g., Vx) from a measured temperature Tx. Specifically, at a given measured temperature Tx obtained on the device in operation (in the field) we thus know that a vertical line 2030 can be drawn at the measured temperature Tx that will cross the first and second voltage lines 2010 and 2020 at points corresponding to interpolated voltages V1_i and V2_i, shown at 2011 and 2021 respectively, and that we can compute the desired interpolated voltage Vx from the crossings 2011 and 2021 defining V1_i and V2_i. Mathematically speaking, the interpolation recognizes that the ratio of $((T2-T1)/(T2-Tx))=((V2\_i-Vx)/(V2\_i-V1\_i))$, or any other suitable relationship that takes into account the one-to-one correspondence between Tx and Vx based on the interpolation of V1_i and V2_i at the operational measured temperature Tx. We can refer to the points 2001, 2002, 2003 and 2004 as known electrical output values, and points 2011 and 2021 as reference electrical output values. The measured temperature Tx can be defined as a measured operational temperature since it is normally obtained in the field during operation of a multi-cell battery system. The result is a temperature-corrected electrical quantity Vx (or a current Ax).

In some aspects, the first and second temperatures are known in an absolute sense, for example, they are respective temperatures known on a measurement scale (e.g., Celsius, Fahrenheit, Kelvin, etc.). However, in yet other aspects, the first and second temperatures can be only relatively determined with respect to one another or some other reference point, and are not known in an absolute sense.

In still another aspect, the present system and technique may be used in determining temperature-based measurements for interpolating among multiple quantities in an electrical system generally, wherein a multi-cell battery management system is but one example.

In another aspect, it is possible to measure and calibrate a current measurement. Battery packs generally need to protect against a short circuit and over current conditions both during charge and discharge. The measurements are generally compared against a reference point, which reflects an over current threshold(s).

Figure 21:
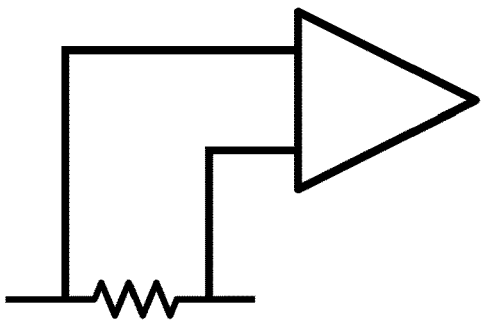
FIG. 21 illustrates the use of exemplary components including resistors and MOSFET components in aspects of the invention.
Figure 21:
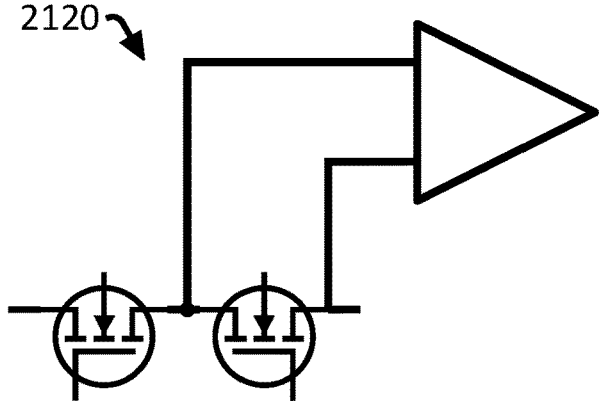
Figure 21:
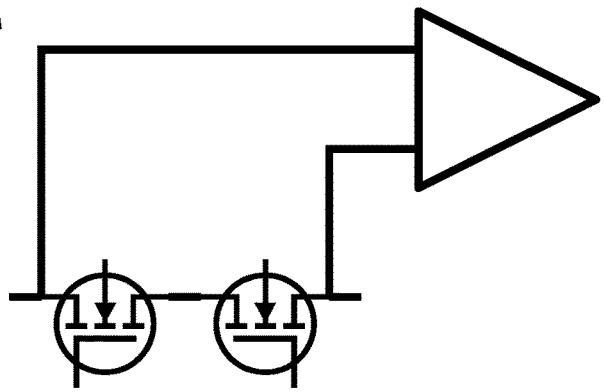

FIG. 21 shows three varieties of sensors that can be employed herein. The sensors can use a resistor sensing 2110 one of the blocking MOSFETs 2120 or using both blocking MOSFETs 2130 to serve as the source of current measurement. The current through any resistance will produce a voltage. This voltage is generally too small to be useful directly, so it needs to be amplified. The resistance used, whether it is a low cost sense resistor, a board trace, or the MOSFETs have initial tolerances that will produce an error if not accounted for. The amplifier also has an offset and potentially a temperature coefficient. These elements also have a temperature coefficient such that when heated the resistance can go up or down. The method described above can overcome the initial error as well as the temperature coefficient. When in final test, a known current can be applied at temperature T1. This result is then kept in nonvolatile memory. The process is then repeated while applying temperature T2. Using these two points and the temperature measurement, all future measurements can be interpolated and compensated, resulting in a relatively accurate measurement of current with respect to the threshold described above.

Figure 22:
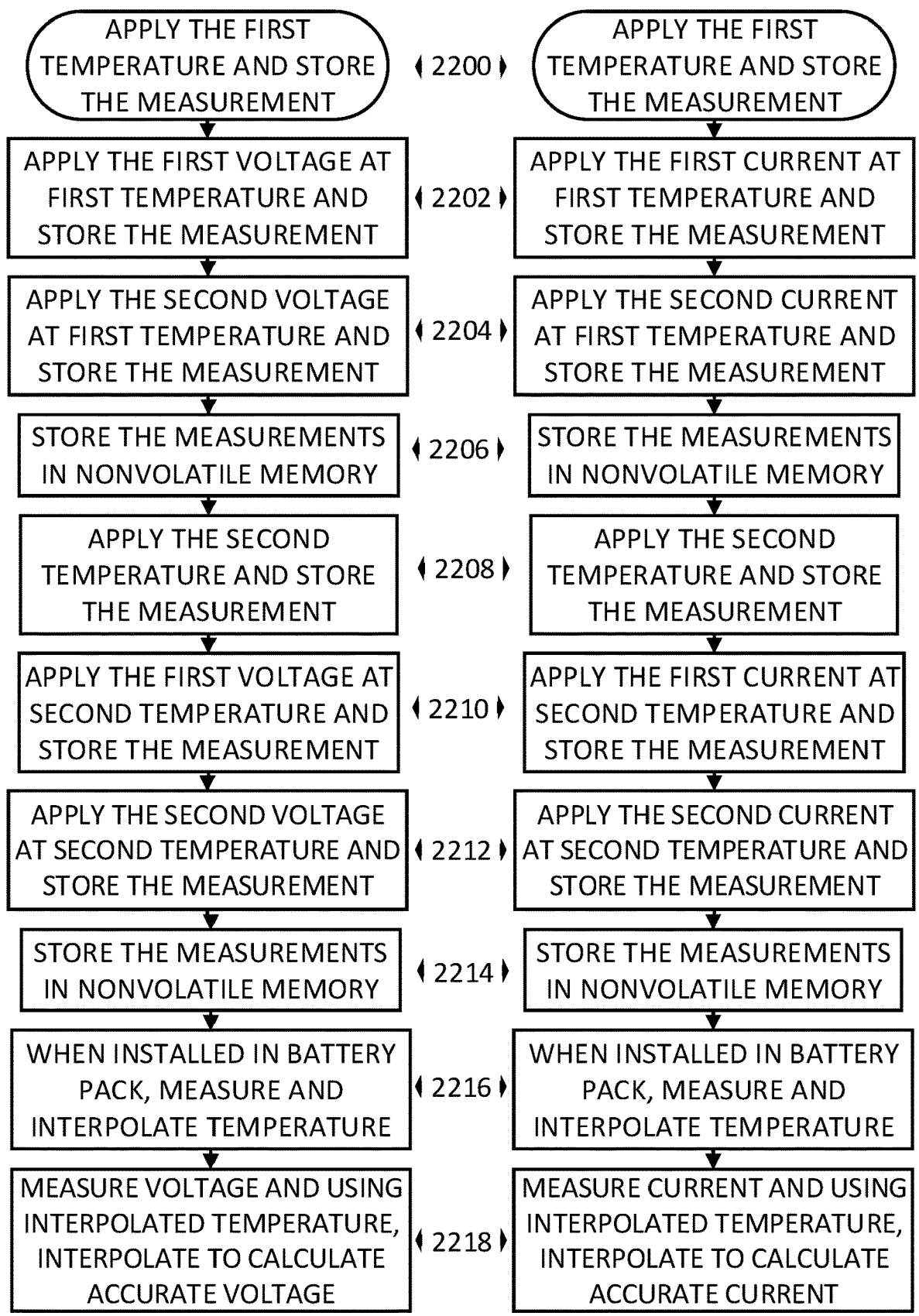
FIG. 22 illustrates a flow chart showing steps of a method for obtaining accurate voltage or current output signals.

FIG. 22 illustrates how an electrical quantity (e.g., voltage or current) can be determined if the sensors for this quantity are temperature dependent, using interpolations as described above. The figure gives a method for applying this to a voltage signal such as from a VCO as well as to a current signal but these are similar and those skilled in the art can adapt their application as necessary based on this disclosure. We discuss examples here with respect to voltages (and values V1, V2, Vx etc.) but these can equally be stated in terms of currents, e.g. A1, A2, Ax etc.

The following steps may be done in a controlled environment such as during the final stages of fabrication of a die or device according to the present invention. At 2200 we apply a first known temperature (T1) and store this temperature. A first known voltage (V1) is applied at temperature T1 and an output of the electrical quantity V1 is also recorded at step 2202. A second known voltage V2 is applied at step 2204 at the first known temperature T1, and the output of the electrical quantity is stored as well. These electrical quantities at temperature T1 form the values 2001 and 2002 on the first and second voltage lines 2010 and 2020 of FIG. 20 above. In this example, the quantities above are stored in a non-volatile memory device or similar unit, depicted at 2206, but the acts of storing and specific implementations and time for doing so can vary as would be appreciated by those skilled in the art.

The device or die is then put at a second known temperature T2, at step 2208, where T2 is different from the first temperature T1. For example, the apparatus or sample may be heated from the first temperature T1 to the second temperature T2 in the controlled environment. In an example, T1 may be at or near room temperature (e.g., approximately 25 C and T2 may be at or near an upper operating temperature for such devices, for example 50C or 70 C). Again, these are illustrative examples and those skilled in the art can understand variations thereof are comprehended by this disclosure. While at temperature T2, the known first and second voltages V1 and V2 are applied and outputs of this electrical quantity at steps 2210 and 2212 respectively are captured and stored. These readings at T2 represent the known quantities 2203 and 2204 of FIG. 20. These quantities are again stored in memory for use in the present interpolation scheme at step 2214.

Once in operation or in the field, e.g., installed in a multi-cell battery pack, the actual apparent temperature Tx described above is measured and interpolated electrical quantities are determined to arrive at the temperature-compensated and interpolated electrical quantity (e.g., Vx) as described above at step 2218.

The prior art uses expensive and highly accurate circuits for battery monitoring system that measure the battery voltage, current in and out of the battery, and temperature or a combination of these inputs to determine the state of the charge of a battery pack, also known as fuel gauging. The presented system and method can use the proposed low cost and simple measuring system for all three inputs and therefore can be utilized to perform such fuel gauging. It is further possible to use a few known and predetermined points of each of these measurements to perform a machine learning algorithm, known to the experts in the field of artificial intelligence, such that through charge and discharge cycles, the system can learn based on the recent history the amount of charge remaining in the pack.

In some aspects, machine learning, artificial intelligence, neural network or expert systems can be employed as part of or in conjunction with the above to develop an optimum strategy for charging, discharging or balancing a multi-cell battery system. Look up tables having prior data, databases populated with information from historical runs or factory or customer testing results, and other data-based methods as known to those skilled in the art can all be employed to achieve this aspect.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A system comprising:
    a multicell battery having n battery cells disposed in series electrically with each other, n being equal to or greater than two;
    a resistor ladder comprising n resistors connected in series electrically with each other, the resistor ladder connected in parallel electrically with the multicell battery;
    n voltage sensors;
    n resistor circuits, each resistor circuit extending across first and second sides of each resistor to measure a resistor voltage across a corresponding resistor;
    n battery cell circuits, each battery cell circuit extending across first and second terminals of each battery cell to measure a battery cell voltage across a corresponding battery cell;
    a plurality of switches configured to operate in a first state or a second state, the first state electrically coupling each resistor circuit to an input of a corresponding voltage sensor and the second state electrically coupling each battery cell circuit to the input of the corresponding voltage sensors;
    a logic circuit electrically coupled to an output of each voltage sensor;
    a memory circuit electrically coupled to the logic circuit, wherein when the plurality of switches are in the first state, each voltage sensor converts the corresponding resistor voltage to a resistor output signal having a property that corresponds to the resistor voltage, and when the plurality of switches are in the second state each voltage converts the corresponding battery cell voltage to a battery cell output signal having a property that corresponds to the battery cell voltage; and
    wherein the logic circuit determines a relation of every battery cell voltage with respect to an ideal balance voltage and other battery cell voltages.

2. The system of claim 1, wherein the logic circuit comprises a state machine, an arithmetic logic unit, or a microcontroller.

3. The system of claim 1, wherein the plurality of switches comprises (n−2)×2+2 switches.

4. The system of claim 1, wherein a first switch is configured to operate in a third state, the third state electrically coupling a reference voltage to the input of one of the n voltage sensors.

5. The system of claim 4, wherein n switches are configured to operate in the third state, the third state electrically coupling a respective reference voltage to the input of the corresponding voltage sensor.

6. The system of claim 1, further comprising a plurality of digital level shifters, each digital level shifter having an input that is electrically coupled to the output of each voltage sensor and an output that is electrically coupled to the input of the logic circuit,
    wherein the digital level shifters are electrically disposed between voltage sensors and the logic circuit.

7. The system of claim 1, wherein the memory circuit comprises a plurality of offset registers registering an offset in a respective resistor output signal.

8. The system of claim 1, further comprising at least one resistor ladder switch having a first state that electrically couples the resistor ladder to the multicell battery and a second state that electrically disconnects the resistor ladder from the multicell battery.

9. The system of claim 1, further comprising two or more of the balancing integrated circuits
    a plurality of balancing integrated circuits;
    n discharge paths, each discharge path disposed in parallel electrically with a corresponding battery cell;
    n discharge circuits, each discharge circuit comprising a corresponding discharge path, each discharge circuit extending across the first and second sides of a corresponding battery cell;
    n discharge transistors electrically coupled to the n discharge circuits, each discharge transistor having (a) a discharge state where a battery cell current from the corresponding battery cell passes through the corresponding discharge circuit to at least partially discharge the corresponding battery cell and (b) an open state where the battery cell current does not pass through the corresponding discharge circuit,
    wherein each balancing integrated circuit is electrically coupled to a respective group of the discharge transistors and each balancing integrated circuit is configured to generate control signals to switch at least one discharge transistor in the respective group of discharge transistors between the discharge state and the open state.

10. The system of claim 9, where a battery cell is shared between the top and bottom IC to assure the balancing act includes a common battery voltage between the two ICs.

11. The system of claim 1, further comprising n level shifters, each level shifter having an input that is electrically coupled to the output of at least one of the switches and an output that is electrically coupled to the input of a corresponding voltage sensor, wherein the level shifters are electrically disposed between the switches and the voltage sensors.

12. The system of claim 1, wherein the voltage sensors comprise voltage-controlled oscillators (VCOs).

13. The system of claim 12, further comprising n counters, each counter having an input that is electrically coupled to an output of each voltage sensor,
wherein when the switches are in the first state,
each VCO converts the corresponding resistor voltage to the resistor output signal, the resistor output signal having a resistor output frequency that corresponds to the respective resistor voltage;
each counter determines a total number of resistor oscillations in the corresponding resistor output signal over a predetermined time period; and
the logic circuit determines an offset in the total number of resistor oscillations for each VCO.

14. The system of claim 13, wherein when the switches are in the second state,
each VCO converts the corresponding battery cell voltage to the battery cell output signal, the battery cell output signal having a battery cell output frequency that corresponds to the respective battery cell voltage; and
each counter determines a total number of battery cell oscillations in the corresponding battery cell output signal over the predetermined time period; and
the logic circuit applies the offsets to the total number of battery cell oscillations to determine a relative corrected battery cell voltage for each battery cell.

15. The system of claim 1, wherein the voltage sensors comprise analog-to-digital converter (ADCs).

16. The system of claim 1, further comprising a temperature sensor providing an output that is mapped to a voltage or current output at a given temperature, said temperature sensor output thereby acting as a calibration for a voltage or current, respectively.

* * * * *